United States Patent
Roizin et al.

(10) Patent No.: US 9,330,748 B2
(45) Date of Patent: May 3, 2016

(54) HIGH-SPEED COMPARE OPERATION USING MAGNETIC TUNNEL JUNCTION ELEMENTS INCLUDING TWO DIFFERENT ANTI-FERROMAGNETIC LAYERS

(71) Applicant: Tower Semiconductor Ltd., Migdal Haemek (IL)

(72) Inventors: Yakov Roizin, Afula (IL); Avi Strum, Haifa (IL)

(73) Assignee: Tower Semiconductor Ltd., Migdal Haemek, IL (US)

( * ) Notice: Subject to any disclaimer, the term of this patent is extended or adjusted under 35 U.S.C. 154(b) by 0 days.

(21) Appl. No.: 14/274,609

(22) Filed: May 9, 2014

(65) Prior Publication Data

US 2015/0325279 A1 Nov. 12, 2015

(51) Int. Cl.
*G11C 11/16* (2006.01)
(52) U.S. Cl.
CPC .......... *G11C 11/1675* (2013.01); *G11C 11/161* (2013.01); *G11C 11/1673* (2013.01)
(58) Field of Classification Search
CPC ........... G11C 11/1675; G11C 11/1673; G11C 11/161
See application file for complete search history.

(56) References Cited

U.S. PATENT DOCUMENTS

| | | | |
|---|---|---|---|
| 6,950,335 B2 | 9/2005 | Dieny | |
| 7,518,897 B2 | 4/2009 | Nozieres et al. | |
| 8,441,844 B2 | 5/2013 | El Baraji et al. | |
| 2002/0167033 A1* | 11/2002 | Okazawa et al. | ............. 257/295 |
| 2005/0007830 A1* | 1/2005 | Perner et al. | ............. 365/189.07 |
| 2007/0097733 A1* | 5/2007 | Perner et al. | ................... 365/158 |
| 2008/0084724 A1* | 4/2008 | Nozieres et al. | ................ 365/50 |
| 2009/0027948 A1 | 1/2009 | Ruehrig | |
| 2009/0190390 A1 | 7/2009 | Wecker | |
| 2009/0251957 A1 | 10/2009 | Javerliac | |
| 2010/0284215 A1 | 11/2010 | Prejbeanu | |
| 2011/0007561 A1 | 1/2011 | Berger et al. | |
| 2011/0110151 A1 | 5/2011 | Prejbeanu | |
| 2011/0211388 A1* | 9/2011 | Torok et al. | ................... 365/158 |

(Continued)

OTHER PUBLICATIONS

Cambou, B. "Match-In-Place™: A novel way to perform secure and fast user's authentication, Implementation into a MLU," Crocus Technology, 2012, 14 pages.

(Continued)

*Primary Examiner* — J. H. Hur
(74) *Attorney, Agent, or Firm* — Bever, Hoffman & Harms, LLP

(57) ABSTRACT

A match-in-place-type compare operation utilizes a string of Magnetic Tunnel Junction (MTJ) elements including storage layers and sense layers having different anti-ferromagnetic structures respectively having higher and lower blocking temperatures. Confidential data is written into the storage layers of the MTJ elements by heating the elements above the higher blocking temperature, and then orienting the storage and sense layers in first storage magnetization directions using field lines. The elements are then cooled to an intermediate temperature between the higher and lower blocking temperatures, and the field lines are turned off, setting the sense layers to preliminary storage magnetization directions opposite to the first directions. During a pre-compare phase, an input logic pattern is written into the sense layers by heating to the intermediate temperature. During a compare operation, with the field lines turned off, resistance of the MTJ string is detected by passing a read current through the string.

19 Claims, 11 Drawing Sheets

(56) References Cited

U.S. PATENT DOCUMENTS

| | | |
|---|---|---|
| 2012/0134057 A1 | 5/2012 | Song |
| 2012/0170357 A1* | 7/2012 | Apalkov et al. ............... 365/158 |
| 2012/0201073 A1 | 8/2012 | Berger et al. |
| 2013/0016551 A1 | 1/2013 | Lombard |
| 2013/0182499 A1 | 7/2013 | Prejbeanu |
| 2013/0208523 A1 | 8/2013 | Alvarez-Herault |
| 2013/0241536 A1 | 9/2013 | Cambou |
| 2014/0016405 A1 | 1/2014 | Dieny |

OTHER PUBLICATIONS

Prejbeanu et al. "Thermally assisted MRAM," Journal of Physics: Condensed Matter 19 (2007), 165218, 26 pages.

Stainer et al. "MRAM with soft reference layer: In-stack combination of memory and log functions," 5th IEEE International Memory Workshop (IMW), May 26-29, 2013, Monterey, CA, USA, pp. 84-87.

\* cited by examiner

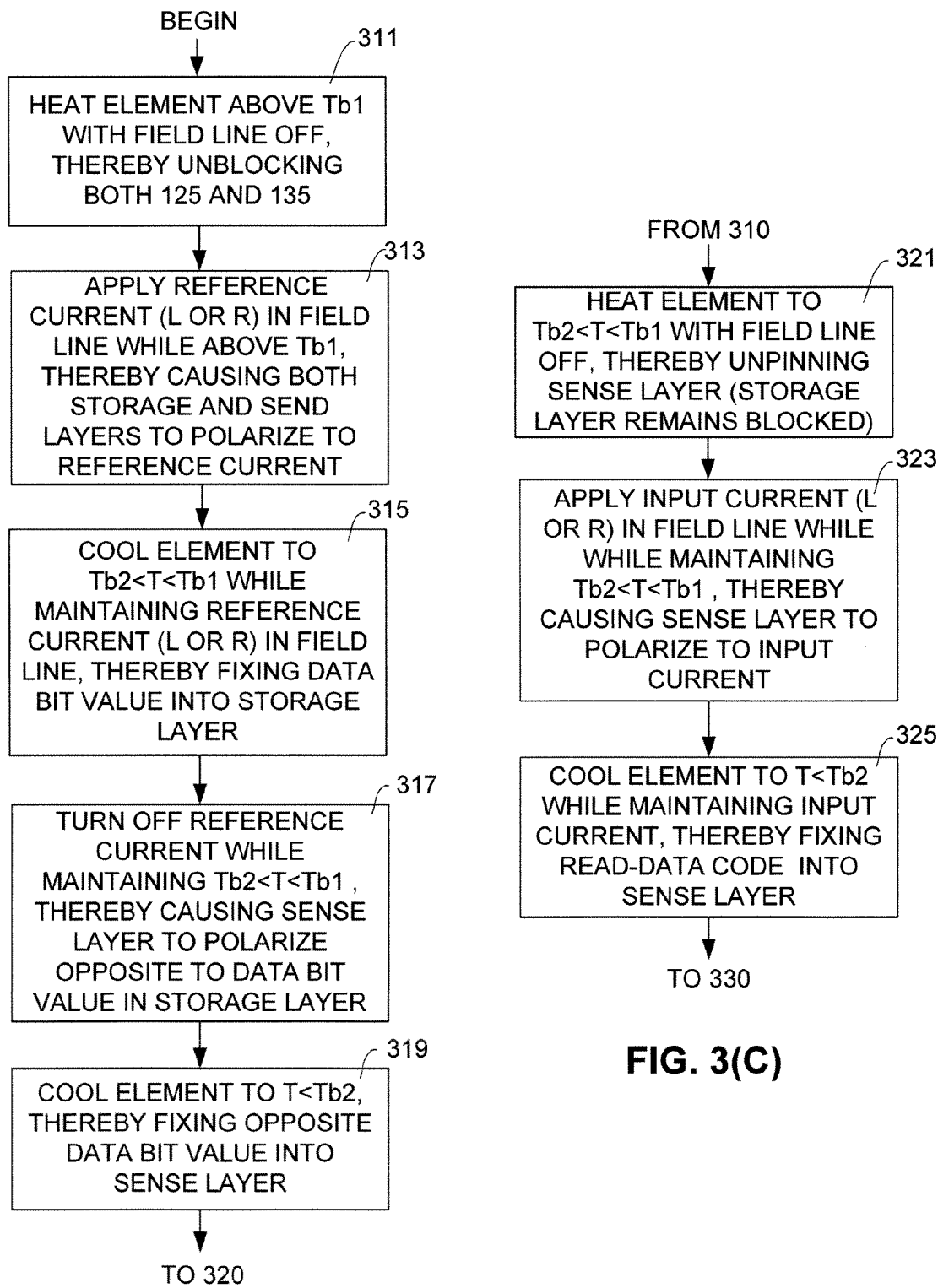

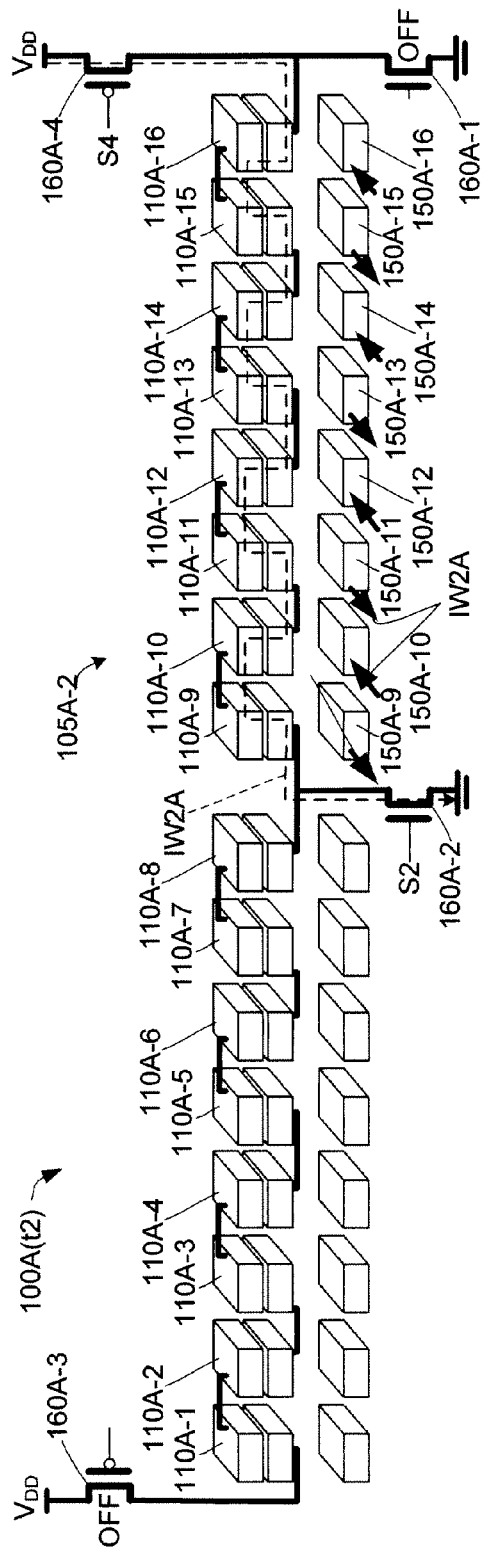
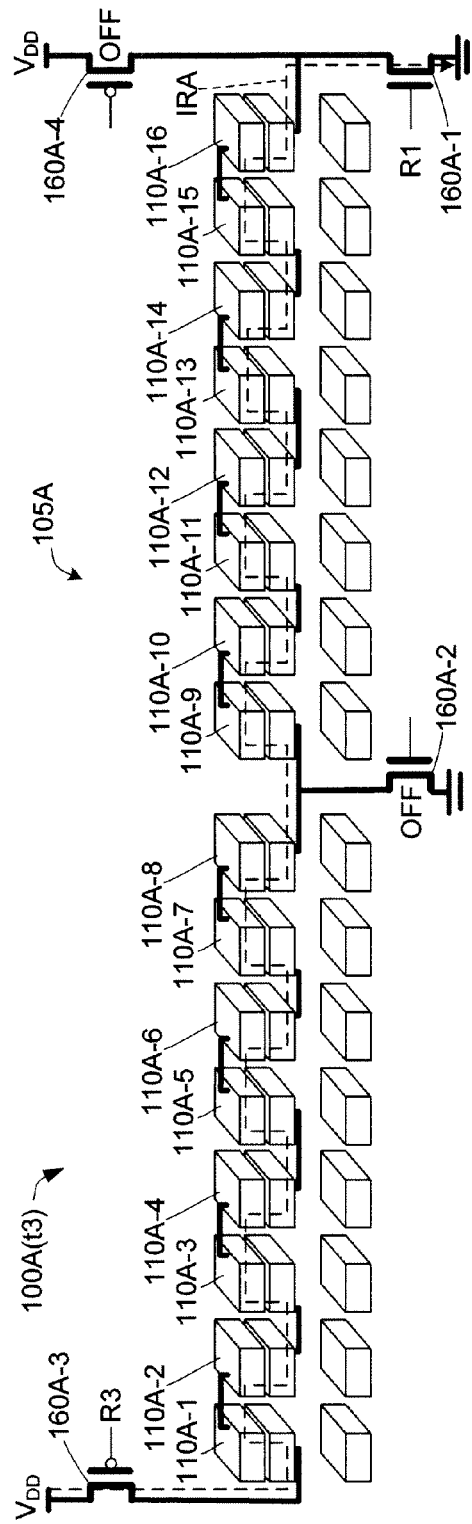

HIGH-SPEED COMPARE OPERATION USING MAGNETIC TUNNEL JUNCTION ELEMENTS INCLUDING TWO DIFFERENT ANTI-FERROMAGNETIC LAYERS

FIELD OF THE INVENTION

This invention relates to match-in-place-type compare operations, and in particular to high-speed match-in-place-type compare operations that are performed using magnetic tunnel junction elements having two different anti-ferromagnetic layers.

BACKGROUND OF THE INVENTION

Magneto-resistive random-access memory (MRAM) is a non-volatile random-access memory technology in which data is stored by magnetic elements, as compared with more popular RAM and DRAM memory types that store data by electric charge or current flows. Each MRAM "cell" typically includes two ferromagnetic electrodes separated by a thin insulating layer, and a resistance to current passing through each MRAM cell depends on the relative directions (i.e., either parallel or anti-parallel) of the electrodes' magnetization. A conventional MRAM cell is read, for example, by measuring its electrical resistance (e.g., by measuring a current passed through the cell from a supply line to ground) while in the presence of an external field that orients one of the two ferroelectric electrodes. When the external field produces parallel alignment of the two electrodes, the MRAM cell exhibits a relatively low resistance. In contrast, when the external field produces anti-parallel alignment of the two electrodes, the MRAM cell exhibits a relatively high resistance.

The physical mechanism explaining the "switchable" resistance variation of MRAM cells is known as spin-polarized tunneling. The insulating layer is thin enough to allow electron tunneling from one ferromagnetic electrode to the other. The two ferromagnetic electrodes have different coercivity values, meaning that one of the ferromagnetic electrodes can be induced to switch its magnetization orientation from one direction to the other using a weaker external magnetic field than that required to switch the other ferromagnetic electrode. One of the ferroelectric electrodes acts as a reference by having a fixed magnetization, while the second one (i.e., the ferroelectric electrode with the smallest coercivity) can be switched by the external magnetic field or by the transfer of spin torque according to a data bit value (i.e., "1" or "0") to be stored. The ferromagnetic electrode that includes the "switchable" ferroelectric layer is sometimes referred to as the cell's "storage layer", and the other ferromagnetic electrode is known as a "reference layer". When the magnetization orientations (directions) of the two ferromagnetic electrodes are parallel, the current through the tunnel dielectric (at the applied readout voltage, which is typically below 1V) is high (i.e., the MRAM cell is in a low resistance state). Conversely, when the magnetization vectors are anti-parallel, the current through the tunnel dielectric is low (i.e., the MRAM cell is in a high resistance state). The typical resistances of high and low states for an MRAM cell having a diameter of 200 nm and MgO thickness of 14 Å are on the order of 2 kOhm and 1 kOhm, respectively. This corresponds to a tunnel magneto-resistance ratio (TMR), of approximately 100%.

In most MRAM cells, the reference layer (i.e., the ferroelectric electrode having fixed magnetization) includes a multilayered structure comprising a ferromagnetic material layer coupled to an anti-ferromagnetic (AF) structure. The AF structure comprises one or more AF materials that generate magnetic moments aligned at the microscale level on different sub-lattices while pointing in opposite directions, causing the total magnetic moment of the AF structure to be close to zero. Placing a ferroelectric layer close to the AF structure causes "pinning" (fixing) of the ferroelectric layer's magnetization direction due to the exchange interaction with the AF structure. However, this pinning effect is only generated while the AF structure is maintained below a corresponding blocking temperature $T_b$ (i.e., a temperature, typically close to the Néel temperature of the AF material, above which the AF structure loses its ability to "pin" (or fix) the magnetization direction of an adjacent ferromagnetic layer). That is, when the temperature reaches the AF structure's blocking temperature $T_b$, the ferromagnetic layer is not pinned, and thus can be switched by relatively weak external magnetic fields, whereby data values may be written into the storage layer, and then subsequently "pinned" (i.e., fixed or frozen) by cooling the cell below the blocking temperature.

Writing data into MRAM cells typically involves applying external magnetic fields (e.g., created by the thick copper field line placed under the MRAM cells) that override the coercivity of the storage layer's ferromagnetic structure. In thermally-assisted switching (TAS, see U.S. Pat. No. 8,441,844, "Method for writing in a MRAM-based memory device with reduced power consumption", Mourad El Baraji, Neal Berger), the writing process further includes heating the MRAM cells above the blocking temperature of the storage layers' AF structures (i.e., by forcing current pulses through the MRAM cells), thereby temporarily "switching-off" the AF structures' ability to pin the associated ferromagnetic layers, and allowing selective switching of the storage layers by way of currents applied through associated field lines. Subsequent cooling of the MRAM cells while maintaining the external magnetic fields causes the associated AF structures to again pin the storage layers in the desired "switched" direction.

U.S. Published Application 2012/0201073 ("Memory Devices with Series-Interconnected Magnetic Random Access Memory Cells", Neal Berger, Mourad El Baraji) teaches the series connection of TAS MRAM cells to form a Magnetic Logic Unit (MLU) string similar to a NAND string, and using the MLU NAND string to perform what is now referred to as Match-in-Place™ (MiP) compare operations. The MRAM cells utilized in the disclosed MLU NAND string differ from "standard" MRAM cells in that the reference layers are replaced with free ferromagnetic layers having low coercivity, which are referred to as a "sense layers" (i.e., the AF structures that pin the ferromagnetic structure in the reference layers of standard MRAM cells are removed; see, e.g., Published Application 2011/0007561, "Self-reference magnetic random access cells", Neal Berger, Jean-Pierre Nozieres). During write operations a logical pattern is written into the storage layers of the modified MRAM cells using the TAS approach described above. During subsequent match comparison (compare) operations, magnetization of the sense layers is controlled by external magnetic fields (e.g., created by the thick copper field line placed under the MRAM cell), which orient the sense layers according to an input logical pattern, and then the resulting total resistance of the MLU NAND string is measured by way of a read current passed through the string. This MLU NAND string approach facilitates several new functionalities, e.g., fabrication of security engines for user authentication, protecting again tampering attacks, etc. Another evident application of the MLU NAND string approach is content addressable memories-CAM (e.g., see U.S. Pat. No. 7,518,897, "System and method for providing content-addressable magnetoresistive random access memory cells", Jean-Pierre Nozieres and Virgile Javerliac).

The above-mentioned use of conventional MLU NAND strings to perform Match-in-Place operations has several disadvantages. For example, in order to provide a reliable security engine, a MLU NAND string must include a large number of MRAM cells to ensure sufficient level of security (i.e., to prevent a hacker from easily replicating the stored confidential logical pattern by simply trying different data bit value combinations). With a typical single MRAM cell resistance of 2 kOhm, the total resistance of a 16 bit string is approximately 32 kOhm while distinguishing, e.g., of 30 kOhm vs 32 kOhm can be critical. To perform matching assignment one has to sense currents at the level of several microamperes. This is close to typical maximum sense amplifier sensitivity, and requires maintaining the compare for a significant amount of time in order to reliably conclude that matching of the stored and input logical pattern has occurred, where the necessary amount of time is at least in the order of at tens of hundreds of nanoseconds, which is considered a significantly long amount of time. In addition, during the matching comparison, currents on the order of several milliamperes must be forced through the field lines in order to generate the required external magnetic fields, resulting in significant power consumption, and also makes tampering attack much easier (i.e., sensing potentials at the field lines carrying high currents is much easier compared with the case of short low-current pulses).

What is needed is a high-speed match-in-place-type compare operation that avoids the long compare times and high current consumption associated with conventional MRAM-based MLU NAND strings.

SUMMARY OF THE INVENTION

The present invention is directed to a method operating one or more Magnetic Tunnel Junction (MTJ) elements to implement a high-speed compare operation that avoids the long compare times and high current consumption associated with conventional MRAM-based MLU NAND strings. Each MTJ element is an MRAM-type memory element including a both a non-volatile storage layer and a non-volatile sense layer that facilitate "fixed" (i.e., stable or non-volatile) storage of both a confidential data bit value and an input data bit value, respectively. During an initial write/program operation, a confidential logic pattern is written into the MTJ elements by orienting and fixing a storage layer of each MTJ element in a (first) storage magnetization direction (e.g., "left" or "right") depending on the confidential data bit value to be stored, and orienting and fixing a sense layer of each MTJ element in an opposite (preliminary) storage magnetization direction (i.e., "right" or "left", opposite to the orientation of the associated storage layer). By fixedly orienting the storage and sense layers of each MTJ element in opposite storage magnetization directions, each and every MTJ element exhibits a high resistance value at the end of the write/program operation, irrespective of its stored confidential data bit value, whereby the confidential logical pattern is "hidden" in the MTJ string. To compare an input logical pattern with the stored confidential logical pattern, a pre-compare phase is performed in which the input logical pattern is fixedly stored into the sense layers of the MTJ elements during a "pre-compare" phase, and then detecting whether the input logical pattern matches the confidential logical pattern by measuring a resistance of the one or more MTJ elements during a compare phase. Writing the input logical pattern involves fixedly orienting the sense layer of each MTJ element in an associated "final" storage magnetization direction (e.g., "right" or "left", depending on the input data bit value to be stored), without changing the confidential data bit value previously stored in the associated storage layer. At the end of the pre-compare phase, each MTJ element retains its high resistance value if the final storage magnetization direction associated with the input data bit value is the same as the opposite (preliminary) storage magnetization direction of the sense layer established at the end of the write/program operation. That is, if the input data bit value written into the sense layer during the pre-compare phase does not match the confidential data bit value stored in the storage layer during write/program, then the MTJ element retains the high resistance value established at the end of the write/program phase. Conversely, the resistance of the MTJ element significantly reduces (i.e., the MTJ element "switches" to exhibit a low resistance value) when the input data bit value (i.e., the "final" storage magnetization direction) stored in the sense layer during the pre-compare phase matches the confidential data bit value (i.e., the "first" storage magnetization direction) stored in the storage layer. Storing both the confidential logical pattern and the input logical pattern in the MTJ elements in this manner facilitates performing the subsequent match-in-place-type compare phase using only a minimal read current passed through the MTJ elements (i.e., unlike the conventional approach, no external magnetic fields are required during the compare phase). The present invention therefore facilitates high-speed compare operations because the amount of time required to perform the pre-compare and compare phases is much lower (i.e., several times lower) than compare operations of conventional approaches that require the generation of external fields representing the input logical pattern. The present invention also strongly decreases power consumption during read-out because no current is needed in the field lines during this time, as required in the conventional methods. Further, writing the "final" bit values into the sense layers is very fast (on the order of 10-20 nanoseconds).

According to an aspect of the invention, each MTJ element includes a storage layer and a sense layer disposed on opposite sides of a tunnel dielectric layer, where the storage layer of each MTJ element includes a (first) antiferromagnetic (AF) structure contacting a (first) ferromagnetic structure and the sense layer includes a (second) AF structure contacting a second ferromagnetic structure, and where the first AF structure has a higher (first) blocking temperature (e.g., in the range of 250-350° C.) than a (lower/second) blocking temperature (e.g., in the range of 150-250° C.) of the second AF structure. The use of two different AF materials in the storage and sense layers, respectively, facilitates high-speed compare operations by facilitating "fixed" storage of the confidential logical pattern during the write/program operation, and "fixed" storage of the input logical pattern (i.e., the data pattern to be compared with the confidential logic pattern) during the pre-compare phase. Specifically, the write/program operation is accomplished in one embodiment by heating (e.g., by passing a heating current through) the MTJ elements to a temperature above the higher (first) blocking temperature (which serves to "unpin" both ferromagnetic structures from their associated AF structures), generating (first) external magnetic fields (e.g., using field lines) such that both ferromagnetic structures of each MTJ element are polarized in a (first) magnetization direction determined by the confidential data bit value to be stored, and the "fixing" (pinning) the ferromagnetic structure of each storage layer in the (first) storage magnetization direction by cooling the MTJ element to temperature below the higher (first) blocking temperature while maintaining the (first) external magnetic fields.

According to another aspect of the invention, the MTJ elements are fabricated such that the storage layer and the associated sense layer of each MTJ element are magnetostatically coupled with an anti-parallel alignment of magnetization vectors. This arrangement facilitates reliably orienting the sense layer of each MTJ element in the "opposite" (preliminary) storage magnetization direction during the write/program operation. Specifically, after the (first) ferromagnetic structures of the MTJ elements are fixed (pinned) in the (first) storage magnetization direction (e.g., by cooling the MTJ elements below the higher (first) blocking temperature), "opposite" values is easily and reliably written into the sense layers of each MTJ element by terminating the external magnetic fields (i.e., while the MTJ elements are at an intermediate temperature between the higher (first) blocking temperature and the lower (second) blocking temperature. At this intermediate temperature, although the storage layers are fixed (pinned), the (second) ferromagnetic structures of the sense layers remain unpinned, so that when the external fields are terminated, the (second) ferromagnetic structures are acted upon by the associated storage layer, such that the sense layers are caused to "switch" into the desired opposite (preliminary) storage magnetization directions by way of the anti-parallel alignment magnetostatic coupling. Subsequent "fixing" of the opposite (preliminary) storage magnetization directions in the sense layers is then accomplished, for example, by further cooling the MTJ elements below the lower (second) blocking temperature.

According to an embodiment of the invention, the pre-compare phase is performed in a manner similar to that used during the write/program operation, but the temperature of the MTJ elements is kept below the higher (first) blocking temperature to prevent loss of the confidential logical pattern stored in the storage layers. Specifically, writing the input logical pattern into the sense layers is accomplished by heating (e.g., using a second heating current passed through) the MTJ elements to the intermediate temperature (i.e., between the higher and lower blocking temperatures), generating (second) external magnetic fields (e.g., using field lines) such that the (second) ferromagnetic structure of the sense layers are polarized in final storage magnetization directions that are determined by the individual data bit values of the input logical pattern, and then fixing (pinning) the second ferromagnetic structure of the sense layers in the final storage magnetization directions by cooling the MTJ elements below the lower (second) blocking temperature (i.e., while maintaining the (second) external magnetic fields).

As set forth above, when both the confidential logical pattern and the input logical pattern are fixedly stored in the MTJ elements, the comparison phase is accomplished by applying a minimal read current through the MTJ elements, and detecting/measuring the collective resistance of the MTJ elements. If the input data bit value stored in any of the MTJ elements fails to match its corresponding confidential data bit value, then at least one of the MTJ elements will exhibit a high resistance value, and detectably smaller (e.g., 10% less or greater) read currents will pass through the MTJ elements, thereby indicating a "no match" condition. Conversely, when the input data bit values stored in each MTJ element match their corresponding confidential data bit values, then all of the MTJ elements will exhibit a low resistance value, and a high read current will pass through the MTJ elements, thereby indicating a "match" condition. Note that the compare operation is performed when there is no current in the field line. This is one of the main differences between the present invention and conventional methods. In the end of the described pre-compare phase, both a confidential data bit value and an associated input data bit value are fixedly stored inside each MTJ cell with no currents in the field lines. The amount of time required to reach this state is much lower (at least several times) than the time needed to perform the comparison of stored and input code using the prior art embodiments.

BRIEF DESCRIPTION OF THE DRAWINGS

These and other features, aspects and advantages of the present invention will become better understood with regard to the following description, appended claims, and accompanying drawings, where:

FIGS. 3(B) and 3(C) are flow diagrams depicting a write/program operation and a pre-compare phase of a compare operation of the method of FIG. 3(A) according to specific embodiments of the present invention;

FIGS. 11(A), 11(B) and 11(C) are simplified diagrams showing the logic unit of FIG. 10 during write/program and compare operations.

DETAILED DESCRIPTION OF THE DRAWINGS

The present invention relates to an improvement in logic units utilized, for example, in security engines or content addressable memory. The following description is presented to enable one of ordinary skill in the art to make and use the invention as provided in the context of a particular application and its requirements. As used herein, directional terms such as "upper" and "lower" are intended to provide relative positions for purposes of description, and are not intended to designate an absolute frame of reference. In addition, the terms "coupled" and "connected", which are utilized herein, are defined as follows. The term "connected" is used to describe a direct connection between two circuit elements, for example, by way of a metal line formed in accordance with normal integrated circuit fabrication techniques. In contrast, the term "coupled" is used to describe either a direct connection or an indirect connection between two circuit elements. For example, two coupled elements may be directly connected by way of a metal line, or indirectly connected by way of an intervening circuit element (e.g., a capacitor, resistor, inductor, or by way of the source/drain terminals of a transistor). Various modifications to the preferred embodiment will be apparent to those with skill in the art, and the general principles defined herein may be applied to other embodiments. Therefore, the present invention is not intended to be limited to the particular embodiments shown and described, but is to be accorded the widest scope consistent with the principles and novel features herein disclosed.

Figure 1:
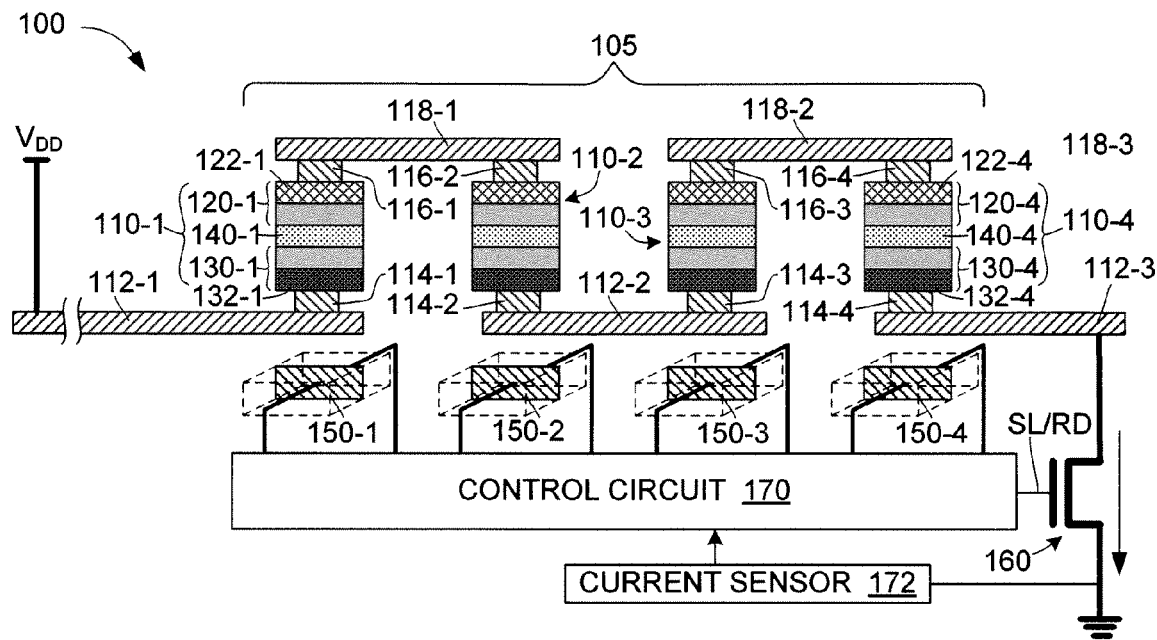
FIG. 1 is a circuit diagram showing a simplified logic unit according to an embodiment of the present invention.

FIG. 1 shows a logic unit 100 according to the present invention that is simplified for explanatory purposes. For example, logic unit 100 is depicted as including a magnetic Tunnel Junction (MTJ) string 105 including four MTJ elements 110-1 to 110-4, whereas in practical embodiments logic units produced in accordance with the present invention typically include MTJ strings including more than four MTJ elements (e.g., 32 or 64 elements), and include a large number of strings (i.e., effectively forming an array of MTJ elements). Other simplifications, such as representing control circuit 170 and current sensor 172 using block diagrams and describing these circuits by their respective functionalities, are employed for brevity.

In accordance with an aspect of the present invention, MTJ elements 110-1 to 110-4 are connected in series such that a current applied to MTJ string 105 passes through all of MTJ elements 110-1 to 110-4. In the simplified embodiment shown in FIG. 1, MTJ elements 110-1 to 110-4 are coupled between a voltage source $V_{DD}$ and a ground terminal by way of at least one select transistor 160. More specifically, voltage source $V_{DD}$ is applied on a conductive line 112-1 (e.g., metallization line), which is coupled to MTJ element 110-1 by way of a metal via 114-1 and an optional select transistor (not shown). MTJ element 110-1 is in turn connected by way of a metal via 116-1 to conductive line 118-1 (e.g., metallization line), which is connected to MTJ element 110-2 by way of a metal via 116-2. MTJ element 110-2 is in turn connected by way of a metal via 114-2 to conductive line 112-2, which is connected to MTJ element 110-3 by way of a metal via 114-3. MTJ element 110-3 is connected by way of a metal via 116-3 to conductive line 118-2, which is connected to MTJ element 110-4 by way of a metal via 116-4. Finally, as indicated at the right side of FIG. 1 and in simplified form in FIG. 2, MTJ element 110-4 is connected by way of a metal via 114-4 to conductive line 112-3, which is coupled to ground by way of select transistor 160. With this arrangement, a current can be established between voltage source $V_{DD}$ and ground through MTJ elements 110-1 to 110-4 by turning on select transistor 160.

In accordance with another aspect, MTJ elements 110-1 to 110-4 respectively include storage layers 120-1 to 120-4 and sense layers 130-1 to 130-4 separated by tunnel dielectric layers 140-1 to 140-4. For example, as indicated at the left end of MTJ string 105 in FIG. 1, MTJ element 110-1 includes storage layer 120-1 and sense layer 130-1 separated by tunnel dielectric layer 140-1. Similarly, as indicated at the right end of MTJ string 105 in FIG. 1 and further illustrated in FIG. 2, MTJ element 110-4 includes tunnel dielectric layer 140-4 disposed between storage layer 120-4 and sense layer 130-4.

Figure 2:
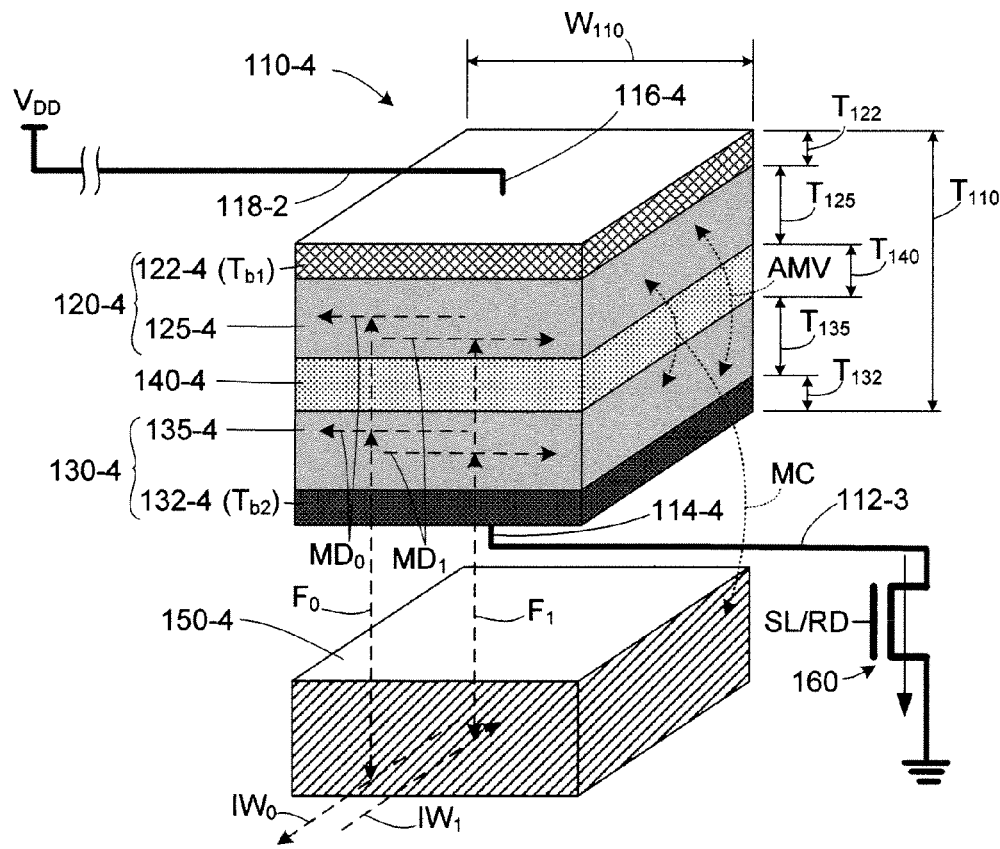
FIG. 2 is simplified perspective view showing a MTJ element of the logic unit of FIG. 1.

In accordance with another aspect, both the storage layer and the sense layer of each MTJ element 110-1 to 110-4 includes both an antiferromagnetic (AF) structure disposed in contact with a ferromagnetic structure. For example, as indicated in FIG. 2, storage layer 120-4 of MTJ element 110-4 includes a first antiferromagnetic (AF) structure 122-4 disposed in contact with an associated (first) ferromagnetic structure 125-4, and sense layer 130-4 of MTJ element 110-4 includes a (second) AF structure 132-4 disposed in contact with an associated (second) ferromagnetic structure 135-4. In a presently preferred embodiment, as indicated in FIGS. 1 and 2, ferromagnetic structures 125-4 and 135-4 are disposed in contact with opposite (upper and lower) surfaces of tunnel dielectric layer 140-4, with AF structures 122-4 and 132-4 disposed on respective opposite (upper and lower) surfaces of ferromagnetic structures 125-4 and 135-4. Ferromagnetic layers 125-4 and 135-4 can include, e.g., Fe, Co, Ni and their alloys, such as, e.g., FeCo.

According to another aspect, the (first or storage layer) AF structure of each MTJ element 110-1 to 110-4 comprises a first AF material having a first blocking temperature $T_{b1}$, the (second or sense layer) AF structure of each MTJ element 110-1 to 110-4 comprises a second AF material having a second blocking temperature $T_{b1}$, and the first and second AF materials are different and arranged such that the first temperature $T_{b1}$ is greater (higher) than the second blocking temperature $T_{b2}$. For example, the (first or storage layer) AF structure of each MTJ element 110-1 to 110-4 (e.g., AF structure 122-4 of MTJ element 110-4) comprises an AF material having a first blocking temperature $T_{b1}$ in the range of 250-350° C., and the (second or sense layer) AF structure of each MTJ element 110-1 to 110-4 (e.g., AF structure 132-4 of MTJ element 110-4) comprises an AF material having second blocking temperature $T_{b2}$ in the range of 150-250° C. In one specific embodiment, the (first or storage layer) AF structure of each MTJ element 110-1 to 110-4 (e.g., AF structure 122-4 of MTJ element 110-4) comprises PtMn or NiMn, and the (second or sense layer) AF structure of each MTJ element 110-1 to 110-4 (e.g., AF structure 132-4 of MTJ element 110-4) comprises FeMn or IrMn. As set forth below, the use of two different AF materials in the storage and sense layers facilitates storing two different data bit values (i.e., a confidential data bit value and an input data bit value) in each MTJ element in a manner that allows compare operations without the use of external magnetic fields, which significantly decreases the amount of time required to perform compare operations. In one embodiment, the AF material can be coupled to a "synthetic AF structure" comprising of two magnetic layers sandwiched with a thin ruthenium layer. Such a synthetic AF structure has a very strong antiparallel coupling. If the ferromagnetic with AF pinning is coupled also to a synthetic AF structure, the coupling of the fixed ferromagnetic layer over the free ferromagnetic layer is small (synthetic antiferromagnet produces small stray magnetic fields extending into the opposite electrode).

According to an aspect of the present invention, MTJ elements 110-1 to 110-4 of logic unit 100 are sized to optimize resistance characteristics in order to facilitate the heating and compare (read) operations that are described below. Referring to FIG. 2, in an exemplary practical embodiment, each MTJ element (e.g., MTJ element 110-4) has an overall cell thickness $T_{110}$ in the range of 50 to 200 nanometers, and has a width/diameter $W_{110}$ (i.e., maximum top view dimension)

in the range of 50 to 500 nanometers, and more preferably in the range of 100 to 250 nanometers. In particular, each first AF structure (e.g., AF structure 122-4) is fabricated with a thickness $T_{122}$ in the range of 10 and 30 nm, each first ferromagnetic structure (e.g., ferromagnetic structure 125-4) is fabricated with a thickness $T_{125}$ in the range of 5 and 70 nm, each tunnel dielectric layer 140-4 (e.g., magnesium oxide (MgO) or aluminum oxide ($Al_2O_3$)) is fabricated with a thicknesses $T_{140}$ in the range of 10 to 20 Angstroms, each second ferromagnetic structure (e.g., ferromagnetic structure 135-4) is fabricated with a thickness $T_{135}$ in the range of 5 and 70 nm, and each second AF structure (e.g., AF structure 132-4) is fabricated with a thickness $T_{132}$ in the range of 5 and 30 nm. Forming MTJ elements 110-1 to 110-4 using these dimensions both minimize fabrication defects (e.g., shorts) and produces desirable resistance characteristics that facilitate the write/program and compare operations that are described below.

Referring again to FIG. 1, logic unit 100 further includes field lines 150-1 to 150-4 that are physically spaced from MTJ elements 110-1 to 110-4 (e.g., disposed below and separated from sense layers 120-1 to 120-4 by intervening dielectric or insulating structures, not shown), and are respectively magnetically coupled to the storage layer 120-4 and sense layer 130-4 of MTJ elements 110-1 to 110-4. For example, as indicated by dashed-line arrow MC in FIG. 2, field line 150-4 is magnetically coupled to storage layer 120-4 and sense layer 130-4. In a similar manner, field line 150-1 is magnetically coupled to storage layer 120-1 and sense layer 130-1 of MTJ 110-1, and field lines 150-2 and 150-3 are magnetically coupled to the sense and storage layers of MTJ elements 110-2 and 110-3, respectively. As indicated in FIG. 1, control circuit 170 is operably coupled to field lines 150-1 to 150-4 such that reference currents are selectively generated in either of two directions along field lines 150-1 to 150-4. As described in additional detail below, this arrangement facilitates storing logical "1" or logical "0" data bit values on MTJ elements 110-1 to 110-4 during write/program operations and during the pre-compare phase of compare operations. Specifically, as indicated in FIG. 2, by generating a reference current $IW_0$ in a first direction along field line 150-4 (i.e., out of the drawing sheet), field line 150-4 generates an external field $F_0$ that biases both storage layer 120-4 and sense layer 130-4 in a first magnetic direction $MD_0$ (e.g., to the "left" in FIG. 2). Alternatively, by generating a reference current $IW_1$ in a first direction along field line 150-4 (i.e., into the drawing sheet), field line 150-4 generates an external field $F_1$ that biases both storage layer 120-4 and sense layer 130-4 in a second magnetic direction $MD_1$ (e.g., to the "right" in FIG. 2). As described in additional detail below, by selectively increasing the temperature of MTJ elements 110-1 to 110-4 above "higher" blocking temperature $T_{b1}$, field lines 150-1 to 150-4 facilitate writing (storing) confidential data bit values in the storage layers of MTJ elements 110-1 to 110-4 during the write/program operation. Similarly, as described below, by selectively increasing the temperature of MTJ elements 110-1 to 110-4 to an "intermediate" temperature that is above "lower" blocking temperature $T_{b2}$ and below "higher" blocking temperature $T_{b1}$ (i.e., $T_{b2}<T<T_{b1}$), field lines 150-1 to 150-4 facilitate writing (storing) input data bit values in the sense layers of MTJ elements 110-1 to 110-4 during the pre-compare phase of the compare operation. Note that, when the temperature falls below one or both blocking temperature, then one or both AF structures will "fix" (pin) the ferromagnetic structures, whereby external magnetic fields $F_0/F_1$ will not control (influence) the storage magnetization directions of one or both of the storage or sense layers. For example, when MTJ element 110-4 cools from above the higher (first) blocking temperature $T_{b1}$ to the intermediate temperature (i.e., $T_{b2}<T<T_{b1}$), ferromagnetic structure 125-4 becomes fixed (pinned) by AF layer 122-4, and subsequent termination or reversal of the reference current in field line 150-4 does not change the storage magnetization direction of the storage layer 120-4). Similarly, when the MTJ element 110-4 cools from the intermediate temperature ($T_{b2}<T<T_{b1}$) to a temperature below the "lower" (second) blocking temperature ($T_{b2}>T$), both ferromagnetic structures 125-4 and 135-4 become "fixed" (pinned) by associated AF layers 122-4 and 132-4 (i.e., subsequent termination or reversal of the reference current in field line 150-4 does not change the storage magnetization direction of either storage layer 120-4 or sense layer 130-4).

According to another aspect, the storage layer and the associated sense layer of each MTJ element are magnetostatically coupled with an anti-parallel alignment of magnetization vectors in a manner similar to that experienced by two bar magnets placed end-to-end. Referring to FIG. 2, the anti-parallel alignment between storage layer 120-4 and associated sense layer 130-4 of MTJ element 110-4 is indicated by double-headed dashed-line arrow AMV. The effect of this anti-parallel alignment is that, when MTJ element 110-4 is at the intermediate temperature, storage layer 120-4 is fixed (pinned) in "left" magnetic direction $MD_0$, and there is no current in field line 150-4, sense layer 130-4 is biased by storage layer 120-4 into "right" magnetic direction $MD_1$. Conversely, when MTJ element 110-4 is at the intermediate temperature, storage layer 120-4 is fixed (pinned) in "right" magnetic direction $MD_1$, and there is no current in field line 150-4, sense layer 130-4 is biased by storage layer 120-4 into "left" magnetic direction $MD_0$. As explained below with reference to the write/program operation, this arrangement facilitates reliably setting each of the MTJ elements in a high resistance state (i.e., no matter which bit value is stored in the MTJ element) prior to the compare operation.

According to an embodiment of the invention, control circuit 170 (or other circuit) is configured using known techniques to control select transistor 160 in order to generate the requisite currents through the MTJ string 105 (e.g., heating currents during the write/program operation and pre-compare phase, and read currents during the compare phase) that are described in detail below. In one embodiment, the heating/read currents through MTJ string 105 are measured using a current sensor 172 that is operably coupled to select transistor 160, and provides measurement data to control circuit 170 using known techniques. In addition to controlling currents through MTJ string 105, control circuit 170 also controls the reference currents generated in the field lines 150-1 to 150-4 that are described in additional detail below, and also generates appropriate logic and control signals associated with the positive and negative results generated during the compare operation.

Figure 3A:
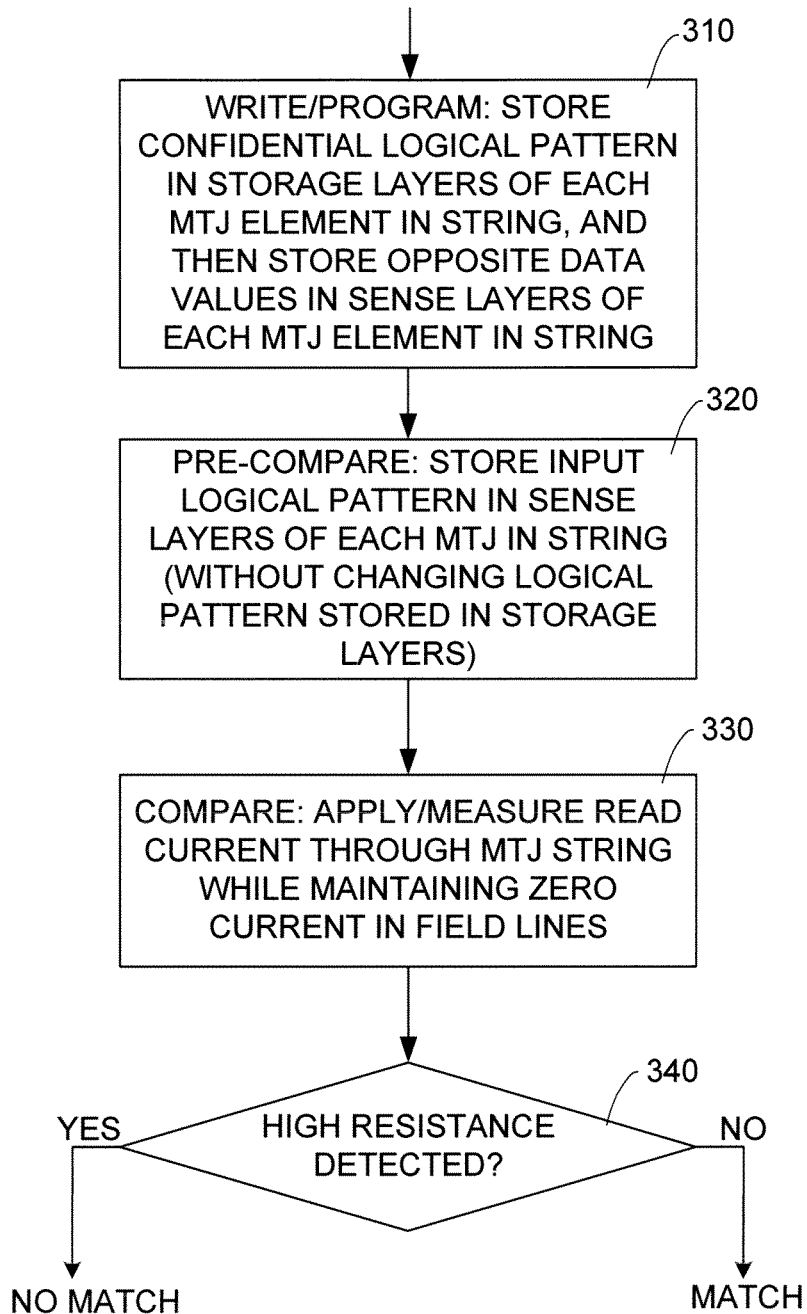
FIG. 3(A) is a flow diagram showing a generalized method for operating the logic unit of FIG. 1 according to an embodiment of the present invention.

FIG. 3(A) is a simplified flow diagram depicting a generalized method for performing a high-speed compare operation. The described compare operation can be performed by a single MTJ element (e.g., MTJ element 110-4 shown in FIG. 2), but is preferably performed using a "string" of MTJ elements (e.g., multiple MTJ elements connected in series, such as in logic unit 100, which is shown and described above with reference to FIGS. 1 and 2). That is, the methodology is applicable to MTJ strings of any length. Moreover, although the methodology is described below with reference to a single string including four MTJ elements, in practical embodiments the methodology is performed in an array made up of multiple MTJ strings having a much larger number of MTJ elements.

Referring to block 310 (at the top of FIG. 3(A)) and to FIG. 1, during a write/program phase (first time period), logic unit 100 is "programmed" to store a confidential logical pattern such that each MTJ element 110-1 to 110-4 stores an associated confidential data bit value (i.e., either "1" or "0") that collectively form the confidential logical pattern. According to an aspect of the present invention, the write/program operation is performed such that the storage layers 120-1 to 120-4 of MTJ elements 110-1 to 110-4 are respectively oriented in associated (first) storage magnetization directions (e.g., "right" or "left") that is determined by the associated stored confidential data bit value (i.e., either "1" or "0"), and such that sense layers 130-1 to 130-4 of are oriented in associated opposite (preliminary) storage magnetization directions. For example, a logic "1" is written into MTJ element 110-1 by orienting storage layer 120-1 in a "right" storage magnetization direction, and orienting sense layer 130-1 in a "left" storage magnetization direction. Conversely, a logic "0" is written into MTJ element 110-1 by orienting storage layer 120-1 in a "left" storage magnetization direction, and orienting sense layer 130-1 in the "right" storage magnetization direction. Of course, the "right" and "left" orientations are arbitrarily assigned to data bits "1" and "0", and may be reversed.

According to an aspect of the invention, once the write/program operation is completed, the stored confidential logical pattern cannot be determined from MTJ elements 110-1 to 110-4 by way of a read current passed through one or more of MTJ elements 110-1 to 110-4 because every MTJ element 110-1 to 110-4 exhibits a high resistance value. As understood in the art, when both the storage and sense layers of an MTJ element are oriented in the same storage magnetization direction (i.e., both "left" or both "right"), the MTJ element exhibits a low resistance value (i.e., a read current is able to pass through the MTJ element with minimal impedance). Conversely, when the storage and sense layers of an MTJ element are oriented in opposite storage magnetization directions, the MTJ element exhibits a high resistance value (i.e., a read current is substantially prevented from passing through the MTJ element). Because the storage and sense layers of each MTJ element 110-1 to 110-4 are oriented in opposite storage magnetization directions whether the element stores a "1" or a "0" bit value, each MTJ element 110-1 to 110-4 exhibits a high resistance value after the write/program operation. Therefore, it is not possible to determine the data bit stored on any MTJ element 110-1 to 110-4 because no matter which bit value ("1" or "0") is written into the storage layer, the opposite bit value is written into the sense layer, so a read current is impeded by high resistance whether the MTJ element stores a "1" or a "0" bit value.

According to another aspect of the invention, a high-speed compare operation is performed in two phases referred to herein as a "pre-compare" (block 320, FIG. 3(A)) during which an "input" logical pattern (i.e., the logic pattern to be compared with the confidential logical pattern) is fixedly written into the MTJ elements, and a "compare" (read) phase (block 330, FIG. 3(A)) during which a read current is passed through the MTJ elements to determine if the input logical pattern matches the confidential logical pattern. Referring to block 320, the pre-compare phase involves writing an input data bit value (i.e., "1" or "0") into the sense layer of each MTJ element (i.e., causing the sense layer to assume an associated "final" storage magnetization direction (i.e., "right" or "left", depending on the input data bit value) without changing the confidential data bit value stored in the storage layer. As indicated in block 330, the compare phase involves applying a read current that passes through the MTJ string, and detecting/measuring the resistance of the MTJ string (e.g., by way of the remaining current passing through select transistor 160, as indicated in FIG. 2). Note that, when the input data bit value written into the sense layer of a given MTJ element does not match the confidential data bit value stored in the storage layer of that MTJ element, the final storage magnetization direction generated during the pre-compare phase remains the same as the previously stored (preliminary) storage magnetization direction (i.e., the magnetization direction of the sense layer that is fixed after the write/program phase is not changed, so the MTJ element retains said high resistance value). Conversely, when the input data bit value matches the previously stored confidential data bit value (i.e., the final storage magnetization direction is opposite to the (preliminary) storage magnetization direction present after the write/program phase), the resistance of the MTJ element is substantially decreased during the pre-compare operation (i.e., the MTJ element exhibits a low resistance value). Accordingly, as indicated in decision block 340 (see bottom of FIG. 3(A)), during the subsequent compare operation, determining whether input data bit value(s) written into one or more series-connected MTJ elements matches the confidential data bit value(s) stored in the MTJ element(s) involves measuring or otherwise detecting the resistance state of the MTJ element(s)—if a high resistance is detected ("YES"), then one or more of the input data bit value(s) do not match the stored confidential data bit value(s), and if a low resistance is detected ("NO"), then all of the one or more of the input data bit value(s) match the stored confidential data bit value(s).

Referring again to block 330 (FIG. 3(A)), according to another aspect of the invention, the compare phase (read operation) is performed while maintaining zero current in field lines (e.g., lines 150-1 to 150-4, shown in FIG. 2) that are used to write the confidential and input logical patterns into the MTJ string. The present invention is thus distinguished over conventional approaches in that, after the write/program operation and the pre-compare phase are completed, both a confidential data bit value and an input data bit value are fixedly stored (i.e., the corresponding magnetic directions are stable with the field lines turned off) in each MTJ element. This feature provides an advantage over prior art approaches in that the amount of time required to achieve the stable "pre-compare" stage is much lower (at least several times lower) than the amount of time needed to perform the comparison of stored and input code using conventional methods prior art embodiments. In addition, the compare phase is performed using a relatively small read current (i.e., several microamperes) without the need for forming external magnetic fields according to the input logical pattern (i.e., there is need to generating milliampere-level currents in the field lines during the match-in-place-type compare phase, which is needed in the conventional approach).

The generalized methodology described above with reference to FIG. 3(A) will now be described in additional detail according to an exemplary specific embodiment. Specifically, an exemplary embodiment of the "write/program" operation (block 310 of FIG. 3(A)) is described below with reference to FIG. 3(B) and FIGS. 4(A) to 4(E), an exemplary embodiment of the "pre-compare" phase (block 320 of FIG. 3(A)) is described below with reference to FIG. 3(B) and FIG. 5, FIGS. 6(A) and 6(B), FIGS. 7(A) and 7(B), and FIGS. 8(A)

and 8(B), and an exemplary embodiment of the "compare" phase is described below with reference to FIGS. 9(A) and 9(B).

Figure 4A:
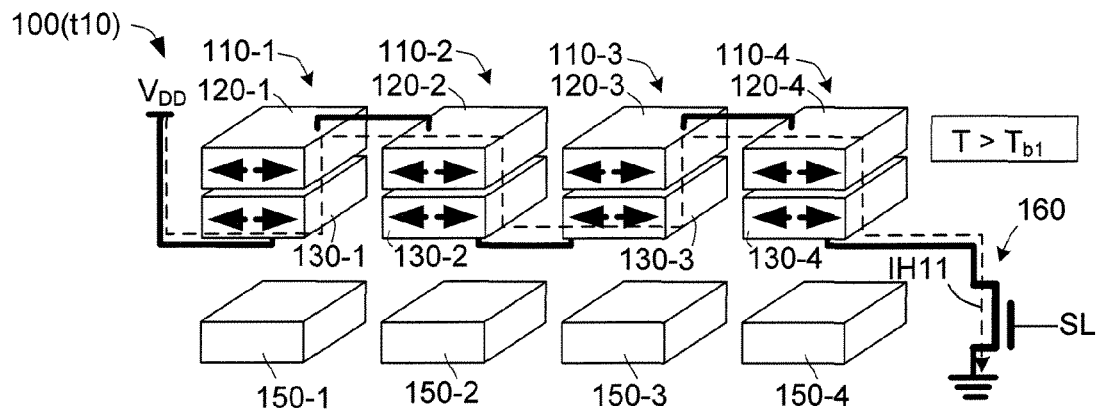
FIGS. 4(A), 4(B), 4(C), 4(D) and 4(E) are simplified diagrams depicting the operation of the logic unit of FIG. 1 during a write/program operation according to the methodology of FIG. 3(B)
Figure 4B:
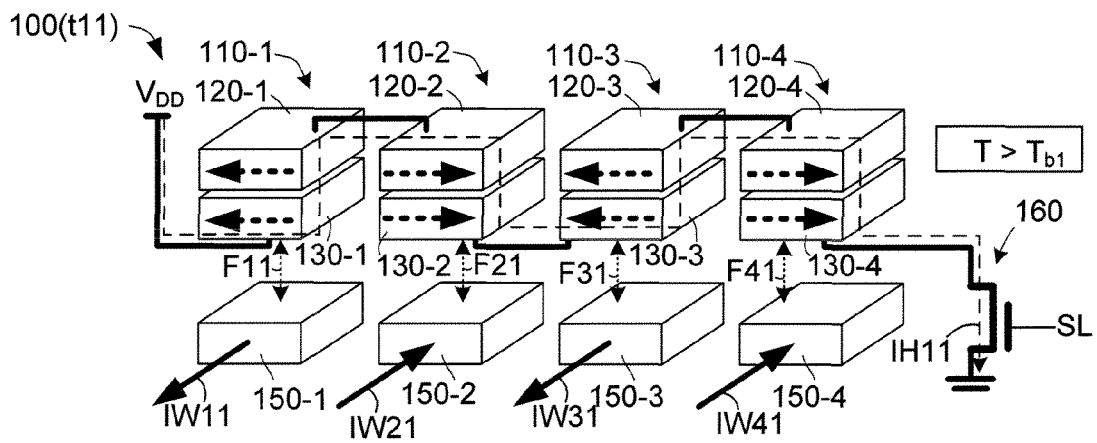

Referring briefly to FIG. 4(A), the write/program and compare operations are described with reference to logic unit 100, which is described in additional detail above with reference to FIG. 1, and is shown in a simplified form in FIGS. 4(A) through 9(B) for brevity. Although the operations are described with reference to the depicted four MTJ element string, those skilled in the art will recognize that the described operations are also applicable to operating a single MTJ element, or a string including a large number of MTJ elements. In addition, a time sequence of events of the operations described with reference to 4(A) through 9(B) is indicated by the notation "txx" next to the reference number "100". For example, FIG. 4(A) depicts logic unit 100 at an initial time t10, which is indicated by the notation "100 (t10)", and FIG. 4(B) depicts logic unit 100 at a subsequent time t11, which is indicated by the notation "100 (t11)". The time sequence notation is intended merely to denote the operation sequence, and is not intended to denote a uniform time period between each depicted operation process.

Referring to block 311 at the top of FIG. 3(B), the write/program operation begins by heating the MTJ string above (higher) blocking temperature $T_{b1}$, which serves to unblock the two ferromagnetic structures respectively disposed in the storage and sense layers of each MTJ element. In an exemplary embodiment, heating of the MTJ string is achieved by asserting select signal SL to activate (turn on) select transistor 160, thereby generating a first "heating" current IH11 that passes through MTJ elements 110-1 to 110-4 between $V_{DD}$ and ground such that the storage layer and sense layer of each MTJ element 110-1 to 110-4 are heated to a temperature T above (higher) blocking voltage $T_{b1}$ of the storage layers (i.e., such that $T>T_{b1}$). In one embodiment, select signal SL is asserted to activate (turn on) select transistor 160 until the temperature of MTJ elements 110-1 to 110-4 exceeds blocking voltage $T_{b1}$. Utilizing element size parameters similar to those discussed above with reference to FIG. 2, a typical current value is 500 μA-1000 μA and the length of the pulse is approximately 50 ns. Once blocking temperature $T_{b1}$ is reached in each MTJ element 110-1 to 110-4, select signal SL is de-asserted to deactivate select transistor 160, thereby opening the source-drain path such that heating current IH11 no longer travels through the MTJ string, and MTJ elements 110-1 to 110-4 therefore begin to cool. If necessary, when the temperature of MTJ elements 110-1 to 110-4 decreases to blocking voltage $T_{b1}$, select signal SL may be again asserted (i.e., pulsed) to maintain the temperature of MTJ element 110-1 to 110-4 above (higher) blocking voltage $T_{b1}$.

As explained above with reference to FIG. 2, the magnetic orientations of ferromagnetic structures 125-4 and 135-4 are respectively fixed by AF material structures 122-4 and 132-4 when MTJ element 110-4 is below (lower) blocking temperature $T_{b2}$. By heating MTJ element 110-4 above (higher) blocking temperature $T_{b1}$, the magnetic orientations of ferromagnetic structures 125-4 and 135-4 are "unblocked" (i.e., free to change direction), and therefore can be oriented (polarized) by magnetic fields generated on field lines 150-1 to 150-4. Referring again to FIG. 4(A), at time t10, when the temperature of MTJ elements 110-1 to 100-4 is above blocking temperature $T_{b1}$, the magnetic orientations of storage layer 120-1 to 120-4 and sense layers 130-1 to 130-4 (as determined by their respective ferromagnetic structures 125-4 and 135-4) can assume either a "left" or "right" orientation, as indicated by the double-headed dashed-line arrows superimposed on MTJ elements 110-1 to 110-4.

FIG. 4(B) depicts logic unit 100(t11), corresponding to block 313 of FIG. 3(B), when reference currents IW11 to IW41 generated in field lines 150-1 to 150-4 according to a confidential logic pattern to be stored in logic unit 100. Select signal SL may be pulsed or otherwise asserted to control select transistor 160 such that heating current IH11 maintains temperature T of MTJ elements 110-1 to 110-4 above higher blocking temperature $T_{b1}$, whereby storage layers 120-1 to 120-4 and sense layers 130-1 to 130-4 remain "unpinned" at time t11, and are therefore magnetically oriented (polarized) according to the confidential data bit value determined by associated reference currents IW11 to IW41. For example, to write a confidential logic pattern "0101" into MTJ elements 110-1 to 110-4, reference currents IW11 to IW41 are forced onto (generated on) field lines 150-1 to 150-4 such that reference currents IW11 and IW13 flow in a first direction along field lines 150-1 and 150-3 (i.e., into the plane of the drawing sheet), and reference currents IW12 and IW12 flow in an opposite (second) direction along field lines 150-2 and 150-4 (i.e., out the drawing sheet plane). In response to reference currents IW11 and IW13, storage layers 120-1 and 120-3 and sense layers 130-1 and 130-3 are polarized (oriented) in a first storage magnetization direction (i.e., "right", as indicated by the rightward-directed dashed-line arrows in FIG. 4(A)), and storage layers 120-2 and 120-4 and sense layers 130-2 and 130-4 are polarized (oriented) in an opposite (preliminary) storage magnetization direction (i.e., "left", as indicated by the leftward-directed dashed-line arrows in FIG. 4(A)). More specifically, referring briefly to FIG. 2, the external magnetic field generated by field line 150-4 in response to reference current IW41 causes both (first) ferromagnetic structure 125-4 and (second) ferromagnetic structure 135-4 to polarize in the (first) "right" magnetization direction (i.e., such that magnetization orientations (directions) of ferromagnetic structures 125-4 and 135-4 are parallel). Note that, because the temperature T of MTJ elements 110-1 to 110-4 is above higher blocking temperature $T_{b1}$ at time t11, the magnetization directions of storage layers 120-1 to 120-4 and sense layers 130-1 to 130-4 are not "fixed" (i.e., unpinned), which is indicated by the dashed-line of each arrow.

Figure 4C:
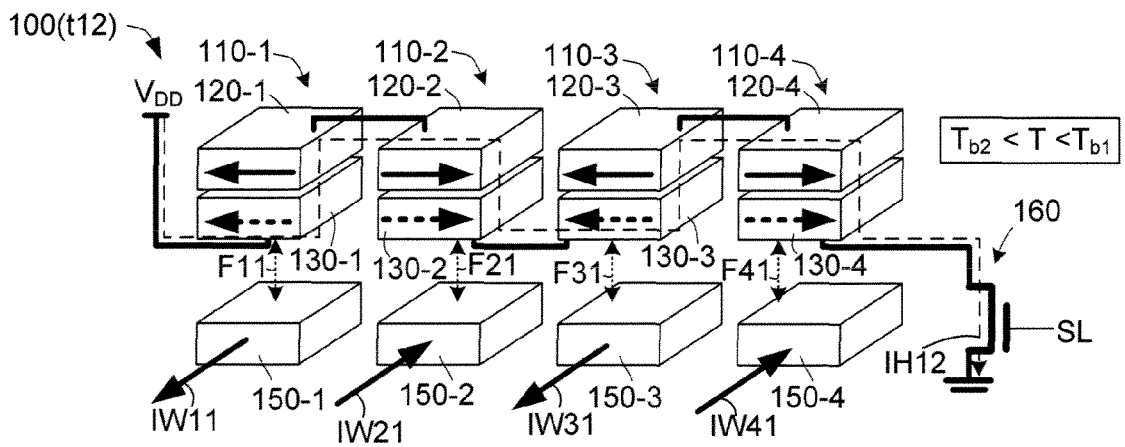

Referring to block 315 of FIG. 3(B), at a subsequent time t12, the MTJ elements are cooled to an intermediate temperature between the first and second blocking temperatures (i.e., below the first blocking temperature $T_{b1}$ and above the second blocking temperature $T_{b2}$). As indicated in FIG. 4(C), this cooling process is performed while generating external magnetic fields F11 to F41 (i.e., while maintaining reference currents IW11 to IW41 in field lines 150-1 to 150-4, respectively). In one embodiment, the cooling process involves controlling select transistor 160 by way of select signal SL, e.g., using shorter (or lower amplitude) pulses that activate select transistor 160 to a lesser degree than that used to achieve higher temperatures, thereby generating a weaker heating current IH12 that allows temperature T of MTJ elements 110-1 to 110-4 to fall below higher blocking temperature $T_{b1}$, but prevents temperature T from falling below lower blocking temperature $T_{b2}$. Utilizing element size parameters similar to those discussed above with reference to FIG. 2, generating the intermediate temperature is achieved using a weaker current pulse, e.g., 300 μA to 700 μA, than that used to generate the higher temperature. Magnetic fields F11 to F41 from field lines 150-1 to 150-4 continue to be applied to storage layers 120-1 to 120-4 as MTJ elements 110-1 to 110-4 cool, and is maintained until thereby "fixing" (freezing) the magnetization direction of storage layers 120-1 to 120-4 in the orientation induced by magnetic fields F11 to F41. Referring to MTJ element 110-4 in FIG. 2, at the element level, as the temperature is below higher blocking temperature $T_{b1}$, AF structure 122-4 fixes (pins) ferromagnetic layer 125-4 in the "right" storage magnetization direction such that the magnetic orientation of ferromagnetic layer 125-4 (and, hence storage layer 120-4) with remain "right" in the subsequent absence of magnetic field F41. Referring again to FIG. 4(C), the now "fixed" (frozen) state of storage layers 120-1 to 120-4 is indicated by superimposed solid-line arrows. In contrast, because the temperature of MTJ elements 110-1 to 110-4 remains above the lower blocking temperature, sense layers 130-1 to 130-4 remain unpinned (as indicated by the superimposed dashed-line arrows), and their respective magnetic directions continue to be determined by magnetic fields F11 to F41. In one embodiment, there is a shift (on the order of 10-40 nanoseconds) between heating current pulses in the MTJs and signal pulses in field lines 150-1 to 150-4 to facilitate cooling of the MTJs while the magnetic field is present.

Figure 4D:
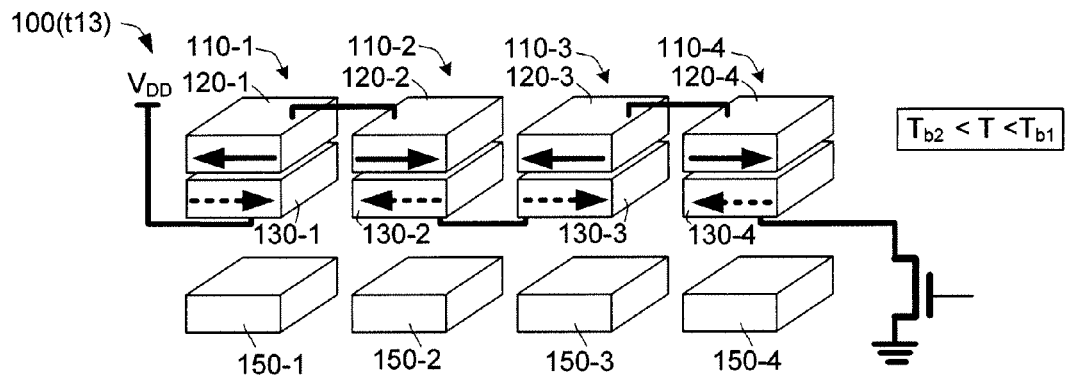

Referring to block 317 of FIG. 3(B) and to FIG. 4(D), at a subsequent time t13, while MTJ elements 110-1 to 110-4 are at the intermediate temperature (i.e., $T_{b2}<T<T_{b1}$), the reference currents applied to field lines 150-1 to 150-4 are turned off, which terminates the external magnetic fields generated by field lines 150-1 to 150-4 on MTJ elements 110-1 to 110-4, thereby causing sense layers 130-1 to 130-4 to assume (preliminary) storage magnetization directions that are opposite to the (first) storage magnetization directions of storage layers 120-1 to 120-4, respectively. As explained above, the storage layer of each MTJ element is magnetostatically coupled with an anti-parallel alignment of magnetization vectors AMV to its associated sense layer (e.g., with reference to FIG. 2, storage layer 120-4 is magnetostatically coupled with an anti-parallel alignment to sense layer 130-4 of MTJ element 110-4). Referring to FIG. 4(D), in a manner similar to that of two bar magnets placed close to each other, this anti-parallel alignment causes sense layer 130-4 to assume a (preliminary) storage magnetization direction (i.e., "left") that is opposite to the (first) storage magnetization direction of storage layer 120-4. In a similar manner, sense layers 130-1 to 130-3 assume (preliminary) storage magnetization directions that are opposite to (first) storage magnetization directions of storage layers 120-1 to 120-3, respectively, as indicated by the superimposed dashed-line arrows in FIG. 4(D).

Figure 4E:
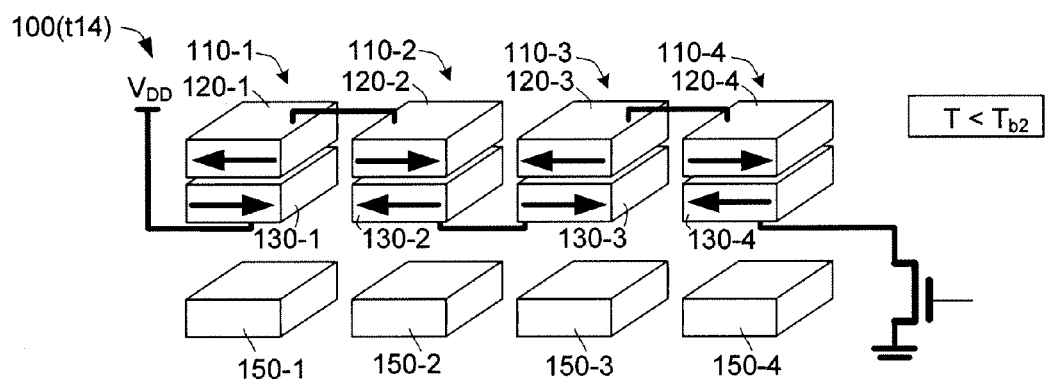

Referring to block 319 of FIG. 3(B) and to FIG. 4(E), at a subsequent time t14, MTJ elements 110-1 to 110-4 are cooled below lower (second) blocking temperature $T_{b2}$, thereby fixing (freezing) sense layers 130-1 to 130-4 in their opposite (preliminary) storage magnetization direction, as indicated by the solid-line arrows superimposed on sense layers 130-1 to 130-4 in FIG. 4(E). As explained above with reference to FIG. 2, the magnetic orientation of ferromagnetic structure 135-4 is fixed by AF material structure 132-4 when MTJ element 110-4 is below (lower) blocking temperature $T_{b2}$. By cooling MTJ element 110-4 below (lower) blocking temperature $T_{b2}$, the magnetic orientations of ferromagnetic structure 135-4 is "fixed" or "pinned" (i.e., prevented from changing direction) by AF material structure 132-4. In a similar manner, sense layers 130-1 to 130-3 are fixed in their respective (preliminary) storage magnetization directions at time t14, as indicated by the superimposed solid-line arrows in FIG. 4(E).

As discussed above, after time t14 a confidential logical pattern is written (stored) into MTJ elements 110-1 to 110-4 in a way that cannot be read by way of a read current passing through the MTJ string. As indicated in FIG. 4(E), storage layers 120-1 to 120-4 now store data bit values that are opposite to those stored in sense layer 130-1 to 130-4, respectively, whereby all of MTJ element 110-1 to 110-4 exhibits high resistance values after the write/program operation is completed. As such, it is not possible to determine the content of the MTJ string by passing a read current through any or all of MTJ elements 110-1 to 110-4 because the read current would be impeded by high resistance no matter what confidential logical pattern is stored in the MTJ string.

Referring again to FIG. 3(A), upon completion of a write/program operation (block 310), the confidential logical pattern stored in the MTJ string is ready to be subject to a match-in-place-type compare (read) operation, which in accordance with the invention include a pre-compare phase (block 320) during which an input logical pattern is written into the sense layers of the MTJ elements, and then a compare phase (block 330) during which a resistance of the MTJ string is measured using an applied read current.

FIG. 3(C) is a flow diagram depicting an exemplary pre-compare operation during which one input data bit value (e.g., "1" or "0") of an input logical pattern is written into the sense layer of each MTJ element (i.e., by orienting each sense layer to an associated final "left" or "right" storage magnetization direction, depending on the input data bit value). The various sub-processes of FIG. 3(C) are illustrated in additional detail in FIGS. 5, 6(A), 6(B), 7(A), 7(B), 8(A) and 8(B), as set forth below. For explanatory purposes, the sub-processes are described both for a "matching" input logical pattern (i.e., an input logical pattern that comprises the same "0101" data pattern as the previously stored confidential logical pattern) in FIGS. 6(A), 7(A) and 8(A), and for a "mismatched" input logical pattern (i.e., an input logical pattern that comprises data bit values "0100") in FIGS. 6(B), 7(B) and 8(B).

Figure 5:
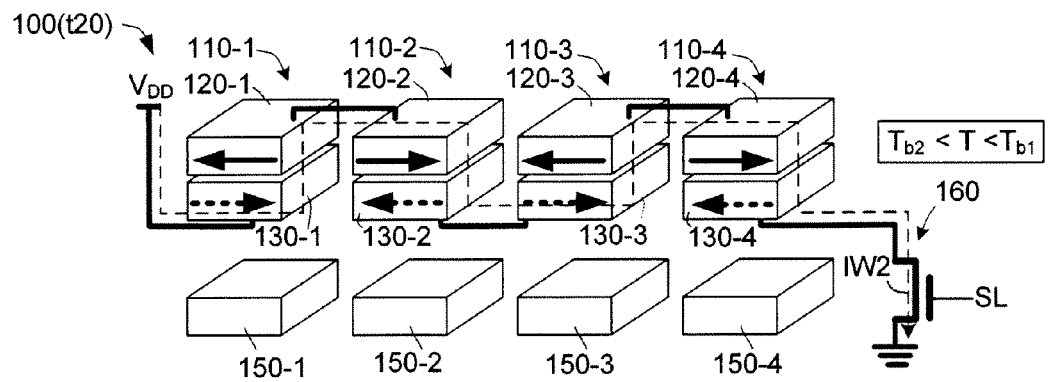
FIG. 5 is a simplified diagram depicting a heating phase of the logic unit of FIG. 1 during a pre-compare phase according to the methodology of FIG. 3(C)

As indicated at the top of FIG. 3(C) and depicted by logic unit 100 (t20) in FIG. 5, the pre-compare phase begins (block 321) at a time t20 by heating MTJ elements 110-1 to 110-5 to the intermediate temperature (i.e., $T_{b2}<T<T_{b1}$) to unpin sense layers 130-1 to 130-5. Similar to the heating process described above with reference to FIG. 3(A), heating at time t20 is achieved by asserting select signal SL to activate select transistor 160, thereby generating a "heating" current IH2 that passes through MTJ elements 110-1 to 110-4, where select signal SL is controlled (e.g., pulsed) in the manner described above to prevent the temperature from exceeding higher blocking temperature $T_{b1}$. Although field lines 150-1 to 150-4 are indicated as being "off" at time t20, this "off" state is not necessary.

Figure 6A:
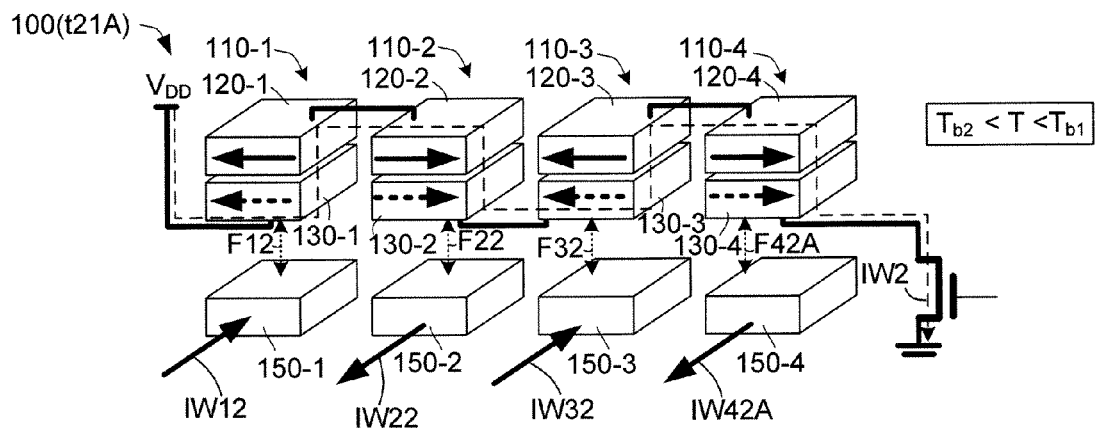
FIGS. 6(A) and 6(B) are simplified diagrams respectively showing the orientation of sense layers according to a matching input data pattern and a mismatched input data pattern, respectively, according to alternative exemplary embodiments during a pre-compare phase according to the methodology of FIG. 3(C)
Figure 6B:
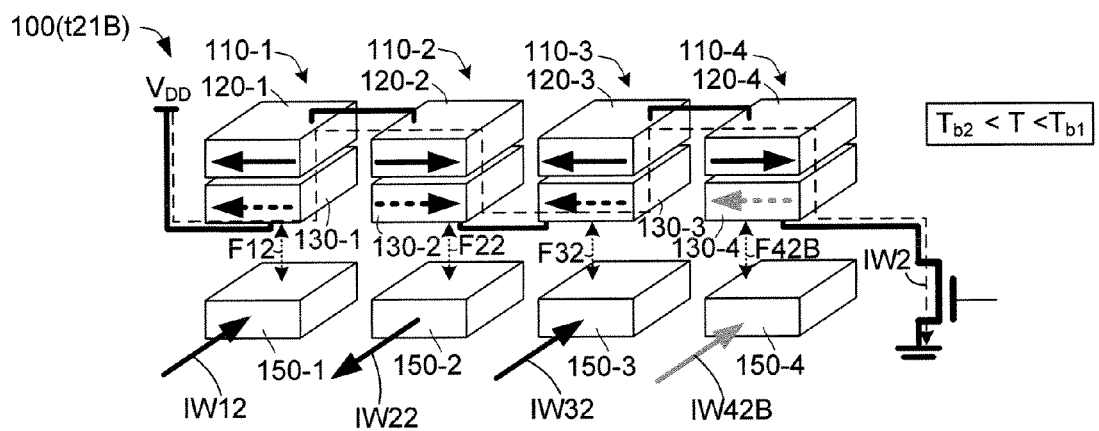

Next, as indicated block 323 of FIG. 3(C), (second) external magnetic fields are generated in accordance with an input logical pattern such that the sense layer of each MTJ element is polarized (oriented) in an associated final storage magnetization direction that is determined by the individual data bit value of the input logical pattern assigned to that MTJ element. This process is illustrated for logic unit 100(t21A) using the "matching" input logical pattern in FIG. 6(A), and for logic unit 100(t21B) using the "mismatched" input logical pattern in FIG. 6(B). Referring to FIG. 6(A), second external magnetic fields F12 to F32 and F42A are generated by applying second reference currents IW12 to IW32 and IW42A on field lines 150-1 to 150-4, respectively, such that sensing layers 130-1 to 130-4 are respectively oriented in accordance with the "matching" input logical pattern (i.e., the storage magnetic direction of each sensing layer 130-1 to 130-4 matches the storage magnetic direction of corresponding storage layers 120-1 to 120-4). More specifically, referring briefly to FIG. 2, the external magnetic field generated by field line 150-4 in response to reference current IW42A causes (second) ferromagnetic structure 135-4 to polarized in the (first) "right" magnetization direction. Referring to FIG. 6(B), second external magnetic fields F12 to F32 and F42B are generated by applying second reference currents IW12 to IW32 and IW42B on field lines 150-1 to 150-4, respectively, such that sensing layers 130-1 to 130-4 are respectively oriented in accordance with the "mismatched" input logical pattern (i.e., the storage magnetic direction of each sensing layer 130-1 to 130-3 matches the storage magnetic direction of corresponding storage layers 120-1 to 120-3, but the storage magnetic direction of sensing layer 130-4 is opposite to the storage magnetic direction of corresponding storage layer 120-4). Note that, as described above, the temperature T of MTJ elements 110-1 to 110-4 is above lower blocking temperature $T_{b2}$ but below higher blocking temperature $T_{b1}$ at time t21, so the magnetization directions of storage layers 120-1 to 120-4 are "fixed" (indicated by solid-lined arrows) and sense layers 130-1 to 130-4 are "unpinned" (indicated by dashed-line arrows).

Figure 7A:
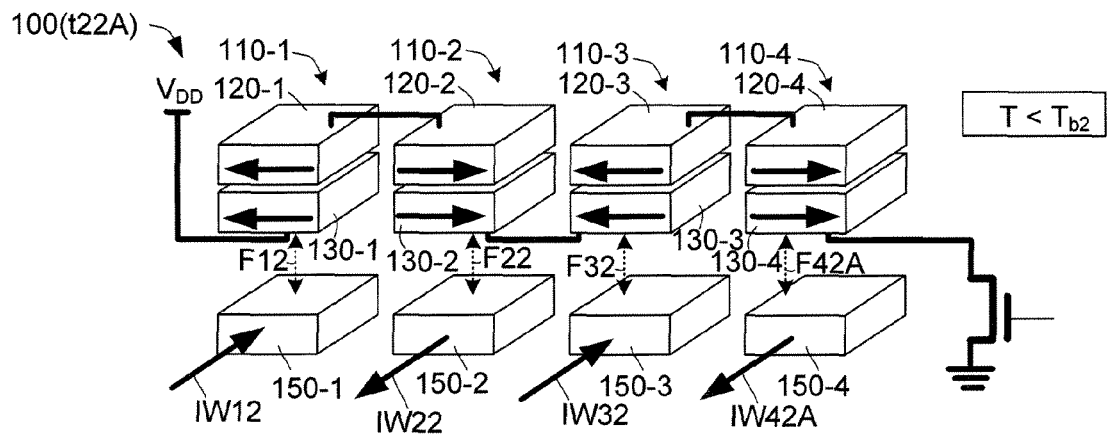
FIGS. 7(A) and 7(B) are simplified diagrams depicting the pinned oriented sense layers of FIGS. 6(A) and 6(B), respectively, at a later point during the pre-compare phase according to the methodology of FIG. 3(C)
Figure 7B:
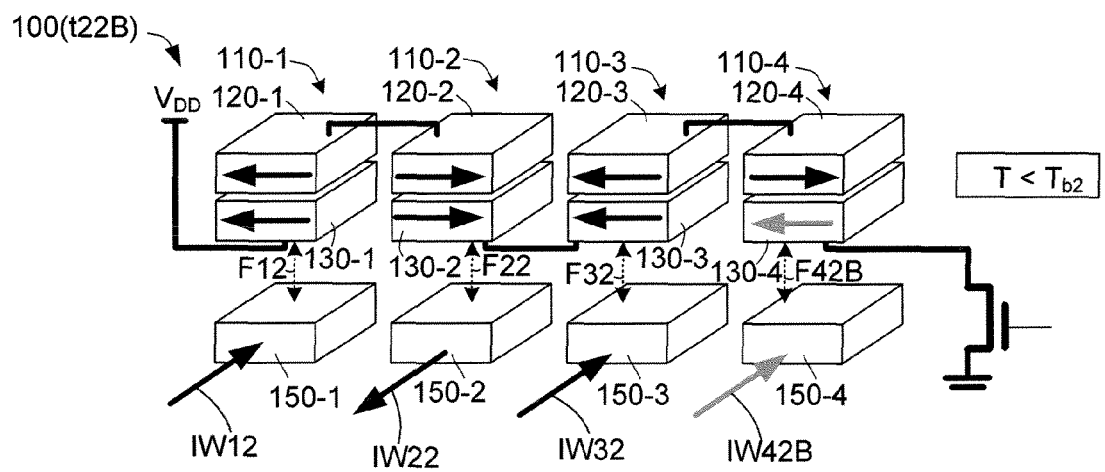
Figure 8A:
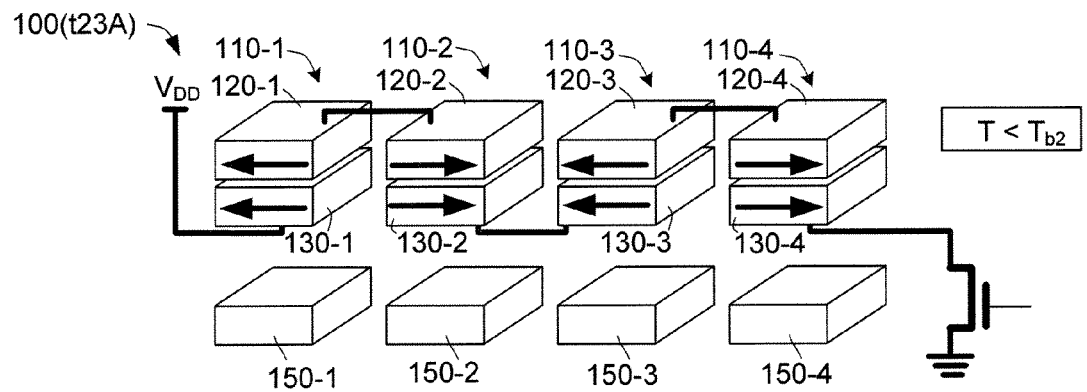
FIGS. 8(A) and 8(B) are simplified diagrams respectively depicting the pinned oriented sense layers of FIGS. 7(A) and 7(B), respectively, at the end of the pre-compare phase according to the methodology of FIG. 3(C)
Figure 8B:
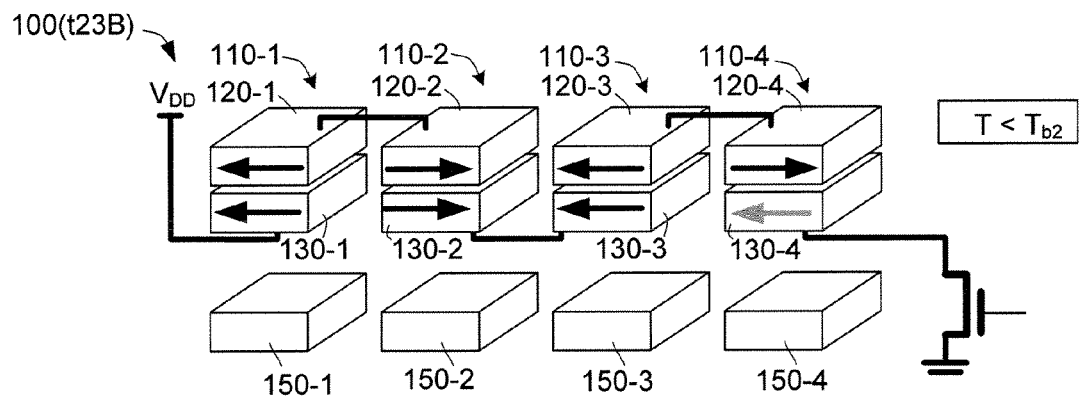

Finally, as indicated in block 325 of FIG. 3(C), the sense layers are pinned (fixed) in the final storage magnetization directions by cooling the MTJ elements below the lower (second) blocking temperature $T_{b2}$. This process is illustrated for the "matching" input logical pattern by logic unit 100 in FIGS. 7(A) and 8(A), and for the "non-matching" input logical pattern in FIGS. 7(B) and 8(B). Referring to FIG. 7(A), at time t22A, while second reference currents IW12 to IW32 and IW42A are still respectively present on field lines 150-1 to 150-4 (i.e., such that second external magnetic fields F12 to F32 and F42A maintain sensing layers 130-1 to 130-3 in the "matching" storage magnetic directions), MTJ elements 110-1 to 110-4 are allowed to cool to a temperature below lower blocking temperature $T_{b2}$, thereby pinning sensing layer 130-1 to 130-4 in the "matching" storage magnetic directions. Subsequently, as indicated in FIG. 7(B), at time t23A, the second reference currents are terminated on field lines 150-1 to 150-4, but MTJ cells 110-1 to 110-4 maintain the matching storage magnetization directions indicated by arrows on storage layers 120-1 to 120-4 and sensing layers 130-1 to 130-4. In a similar manner, FIG. 8(A) shows logic unit 100(t22B) while second reference currents IW12 to IW32 and IW42B are still respectively present on field lines 150-1 to 150-4 (i.e., such that second external magnetic fields F12 to F32 and F42B maintain sensing layer 130-1 to 130-3 in the "mismatched" storage magnetic directions), MTJ elements 110-1 to 110-4 are allowed to cool to a temperature below lower blocking temperature $T_{b2}$, thereby pinning sensing layers 130-1 to 130-3 in "matching" storage magnetic directions, but pinning sensing layer 130-4 in a "mismatched" storage magnetic direction (i.e., opposite to that of storage layer 120-4). Subsequently, as indicated in FIG. 8(B), at time t23B, the second reference currents are terminated on field lines 150-1 to 150-4. In this case, MTJ elements 110-1 to 110-3 maintain matching storage magnetization directions indicated by arrows on storage layers 120-1 to 120-3 and sensing layers 130-1 to 130-3, but MTJ element 110-4 maintains mismatched storage magnetization directions indicated by arrows on storage layer 120-4 and sensing layer 130-4.

Referring again to block 330 in FIG. 3(A), a subsequent compare phase is performed to determine whether the input logical pattern matches the confidential logical pattern by generating a read current through the MTJ string, and determining whether one or more of the MTJ elements are storing mismatched data bit values based on measured resistance of the MTJ string. The compare phase is illustrated for the "matching" input logical pattern by logic unit 100(t24A) in FIG. 9(A), and for the "non-matching" input logical patter by logic unit 100(t24B) in FIG. 9(B). Referring to FIG. 9(A), at time t24A, select transistor 160 is activated by read signal RD to generate a read current through the MTJ string formed by MTJ elements 110-1 to 110-4. In this case, because the final storage magnetization directions fixed in sense layer 130-1 to 130-4 matches the (first) storage magnetization directions fixed in storage layers 120-1 to 120-4, the MTJ string exhibits little or no resistance to read current IR1, which is measured (sensed) using known techniques, thereby establishing that the input logical pattern matches the confidential logical pattern. Conversely, as indicated in FIG. 9(B), when select transistor 160 is activated by read signal RD at time t24B, read current IR2 passing through the MTJ string formed by MTJ elements 110-1 to 110-4 encounters significantly higher resistance due to the mismatched information stored in MTJ element 110-4. That is, because the final storage magnetization direction fixed in sense layer 130-4 is opposite to the (first) storage magnetization direction fixed in storage layer 120-4, current through the MTJ string is resisted, which is measurable (sensed) using known techniques, thereby establishing that the input logical pattern fails to match the confidential logical pattern.

Figure 9A:
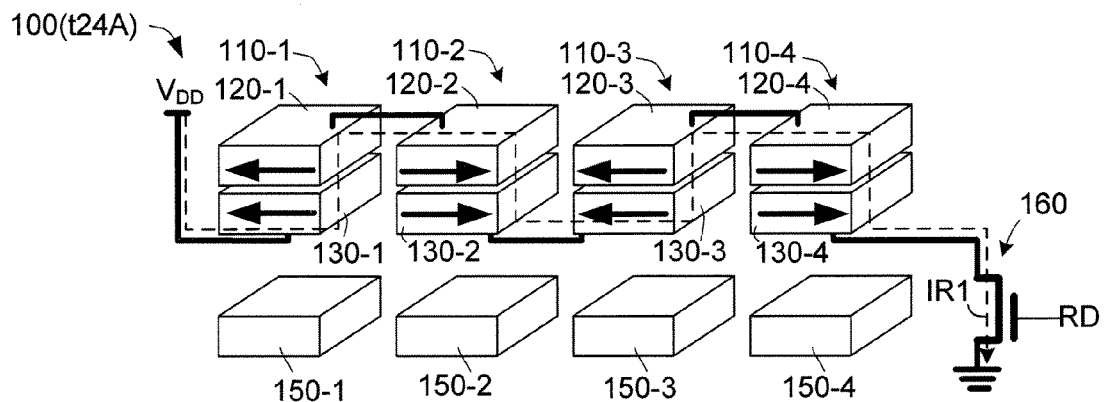
FIGS. 9(A) and 9(B) are simplified diagrams respectively depicting the comparison of a confidential logical pattern with a matching input data pattern and a mismatched input data pattern, respectively, according to alternative exemplary embodiments during a compare phase according to the methodology of FIG. 3(A)
Figure 9B:
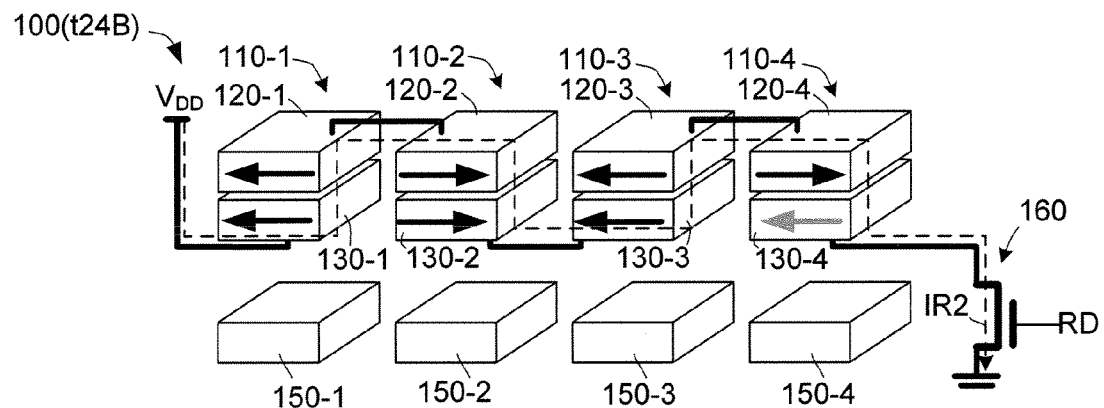

As indicated in FIGS. 9(A) and 9(B), the compare phase is performed with zero current in field lines 150-1 to 150-4. This is one of the main differences between the present invention and conventional methods. In the end of the above-described pre-compare phase, both the confidential data bit values and the associated input data bit values are fixedly respectively stored in the storage and sense layers of each MTJ cell, and the external fields used to store the data bit values are tuned off. The amount of time required to perform the pre-compare and compare phases is much lower (at least several times) than the time needed to perform the comparison of stored and input code using the prior art embodiments.

Figure 10:
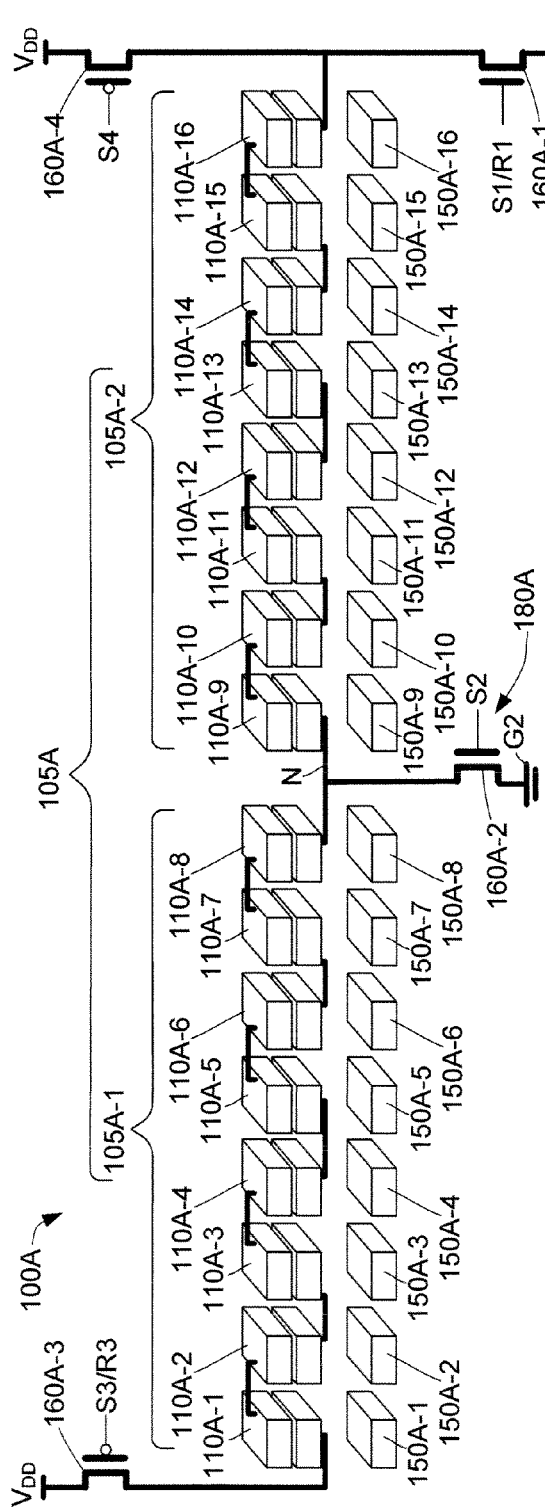
FIG. 10 is a simplified diagram depicting a logic unit including an intermediate connection according to an alternative embodiment of the present invention.

FIG. 10 shows a logic unit 100A according to another embodiment including a string 105A having sixteen MTJ elements 110A-1 to 110A-16 connected in series to form a NAND-type structure similar to that described above with reference to logic unit 100. Each of MTJ elements 110A-1 to 110A-16 is fabricated to include AF layers in both storage and sense layers in the manner described above, and is respectively magnetically coupled to an associated field line 150A-1 to 150A-16. In addition, a select transistor 160A-1 is connected between ground and the last MTJ element in string 105A (i.e., MTJ element 110A-16) to facilitate read currents that pass through all sixteen MTJ elements during compare operations, whereby a positive compare result is generated (i.e., a lowest string resistance is measured) when all sixteen MTJ elements 110A-1 to 110A-16 store matching confidential and input data bits in the manner described above.

In accordance with an aspect of the embodiment shown in FIG. 10, logic units having longer MTJ strings include one or more intermediate connections that are provided after each predetermined set (e.g., eight or sixteen) of MTJ elements to facilitate passing heating currents only through a portion (e.g., one half or one fourth) of the longer MTJ string. For example, logic unit 100A includes an intermediate connection 180A that is implemented by a second select transistor 160A-2 connected between ground and a node N that located between MTJ element 110A-8 and MTJ element 110A-9, whereby string 105A is effectively separated into a first string portion 105A-1 (including MTJ elements 110A-1 to 110A-8) and a second string portion 105A-2 (including MTJ elements 110A-9 to 110A-16). To further facilitate separate current flows through of string portions 105A-1 and 105A-2, a first pull-up transistor 160A-3 is connected between voltage source $V_{DD}$ and MTJ element 110A-1, and a second pull-up transistor 160A-4 is connected between voltage source $V_{DD}$ and MTJ element 110A-16 (i.e., to the end of string 105A). Select transistors 160A-1 and 160A-2 and pull-up transistors 160A-3 and 160A-4 are operated by a control circuit similar to control circuit 170 (shown in FIG. 1) to facilitate the modified write/program and compare operations described below.

Figure 11A:
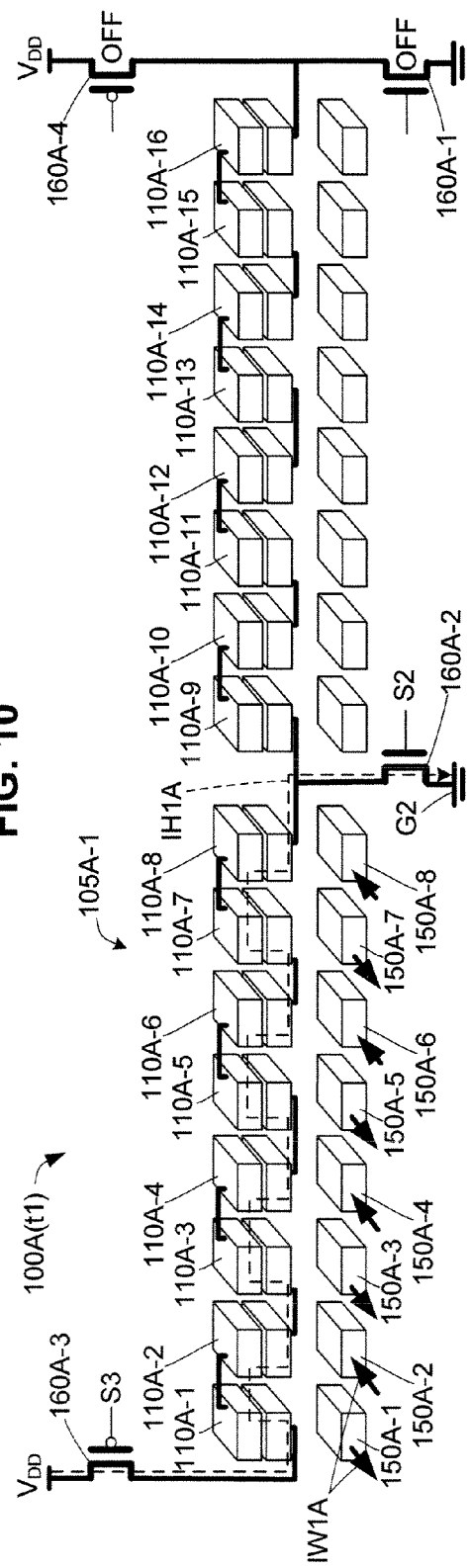

According to another aspect of the present embodiment, the one or more intermediate connections and associated select transistors are utilized to write confidential data bit values and input data bit values into one MTJ string portion at a time. For example, FIG. 11(A) shows logic unit 100A during a first time period t1, which corresponds either to the write/program operation or the pre-compare phase that are described above. During time period t1, pull-up transistor 160A-3 and select transistor 160A-2 are turned on (pull-up transistor 160A-4 and select transistor 160A-1 are turned off) to generate a heating current IH1A between voltage source $V_{DD}$ and (second) ground terminal G2 that passes through string portion 105A-1 (i.e., through the (first) MTJ element group including MTJ elements 110A-1 to 110A-8). In addition, when MTJ elements 110A-1 to 110A-8 have reached the required temperature (i.e., above the higher (first) blocking temperature in the case of a write/program operation, or to the intermediate temperature in the case of a pre-compare phase), first reference currents IW1A are passed through a (first) group of field lines (i.e., through field lines 150A-1 to 150A-8) that are magnetically coupled to MTJ elements 110A-1 to 110A-8, respectively, whereby a logical pattern is transferred (written) onto the first MTJ group in the manner described above. FIG. 11(B) shows logic unit 100A during a subsequent time period t2, during the same write/program operation or pre-compare phase depicted in FIG. 11(A), when pull-up transistor 160A-3 is turned off and pull-up transistor 160A-4 is turned on (select transistor 160A-2 remains on), thereby generating a (second) heating current IH2A that is passed between voltage source $V_{DD}$ and (second) ground terminal G2 through string portion 105A-2 (i.e., through the (second) MTJ element group including MTJ elements 110A-9 to 110A-16). When MTJ elements 110A-9 to 110A-16 have reached the required temperature, second reference currents IW2A are passed through a (second) group of field lines (i.e., through field lines 150A-9 to 150A-16) to perform a desired write operation in the second MTJ group. FIG. 11(C) shows logic unit 100A during a subsequent time period t3, which corresponds to a compare phase that follows a pre-compare phase performed as shown above with reference to FIGS. 11(A) and 11(B). A time t3, "intermediate" select transistor 160A-2 and pull-up transistor 160A-4 are turned off, and pull-up transistor 160A-3 and select transistor 160A-1 are turned on in a manner that generates a read current IRA through string 105A (i.e., through all of MTJ elements 110A-1 to 110A-16) while zero current is passed through the field lines.

The generalized circuit structure illustrated in FIG. 10 and the methodology illustrated in FIGS. 11(A) to 11(C) facilitate the production of security engines and CAM circuits having almost any bit length, which provides several advantages over conventional MLU NAND strings. First, because each MTJ element 110A-1 to 110A-16 includes both storage and sense layers having AF structures, both a confidential logical pattern and an input logical pattern are stably stored in each MTJ element prior to the compare operation, which is then performed without requiring reference currents in field lines 150A-1 to 150A-16. In contrast, although write confidential data bit values may be written into the storage layers of conventional MRAM cells using the methodology of FIGS. 11(A) and 11(B), it is not possible to "write" an input logical pattern into the sense layers of conventional MRAM cells in the manner depicted in FIGS. 11(A) and 11(B), and then perform the "read" operation depicted in FIG. 11(C). Further, although it may be possible to perform the compare operation in portions using MLU NAND strings in "portions" (i.e., by sequentially "reading" portions of the string, and then utilizing an algorithm to determine whether all portions of the string achieved a "match" result), this approach makes it easier for a hacker to access or deduce the stored confidential information. By enabling logic unit 100A to pass the relatively small read current IRA through the entire MTJ string 105A without requiring high current consumption in the field lines, the present invention facilitates the fabrication of security engines and CAM circuits of almost any practical length. Alternatively, write/read currents are passed through random portions of a longer MTJ string (e.g., in a 32 element string, elements 9-16 are written/read first, then elements 1-8, etc.) to reduce power consumption at the expense of longer read/write times.

As set forth above, the MTJ string of the present invention is never subjected a temperature above the (higher) blocking temperature $T_{b1}$ of the storage layers during the compare operation, so the confidential logical pattern entered during the write/program operation remains securely stored in the MTJ string until a new write/program operation is performed, and the MTJ string will not exhibit a low resistance state until an input logical pattern is written into the sense layers that matches the stored confidential logical pattern.

Although the present invention has been described with respect to certain specific embodiments, it will be clear to those skilled in the art that the inventive features of the present invention are applicable to other embodiments as well, all of which are intended to fall within the scope of the present invention. For example, although the present invention is described with a convention in which a "left" magnetic direction is used to indicate a logic "0" and "right" for logic "1", those skilled in the art understand that the opposite convention can also be used (i.e., a "left" magnetic direction may be used to indicate a logic "1", and "right" for logic "0").

The invention claimed is:

1. A method for performing a high-speed compare operation to determine whether an input data bit value matches a previously stored confidential data bit value using at least one magnetic Tunnel Junction (MTJ) element including a non-volatile storage layer and a non-volatile sense layer separated by a tunnel junction layer, the method comprising:

during a write/program operation, writing said confidential data bit value into the MTJ element by fixing the non-volatile storage layer in an associated first storage magnetization direction determined by said confidential data bit value, and fixing the non-volatile sense layer in an associated preliminary storage magnetization direction that is opposite to the first magnetization direction, whereby said MTJ element exhibits a high resistance value at the end of said write/program operation;

during a pre-compare phase performed subsequent to the write/program operation, writing said input data bit value into the non-volatile sense layer by fixing the sense layer in an associated final storage magnetization direction determined by said input data bit value without changing said confidential data bit value non-volatilely stored in said non-volatile storage layer, whereby at the end of said pre-compare phase, said confidential data bit value is non-volatilely stored in said non-volatile storage layer and said input data bit value is non-volatilely stored in said non-volatile sense layer, wherein said MTJ element retains said high resistance value when said final storage magnetization direction is the same as said preliminary storage magnetization direction, and said MTJ element exhibits a low resistance value when said final storage magnetization direction is opposite to said preliminary storage magnetization direction; and during a compare phase performed subsequent to the pre-compare phase, determining if the input data bit value matches the confidential data bit value by measuring a resistance of said MTJ element, wherein said MTJ element further includes an associated field line that is magnetically coupled to said storage layer and said sense layer, wherein writing said confidential data bit value comprises applying a first reference current on said field line, wherein writing said input data bit value comprises applying a second reference current on said field line, and wherein measuring said resistance of said MTJ element comprises applying a read current through the MTJ element while zero current is applied to said field line.

2. The method of claim 1, wherein the non-volatile storage layer comprises a first antiferromagnetic structure contacting a first ferromagnetic structure, the first antiferromagnetic structure comprising a first material having a first blocking temperature, wherein the sense layer comprises a second antiferromagnetic structure contacting a second ferromagnetic structure, the second antiferromagnetic structure comprising a second antiferromagnetic material having a second blocking temperature, and wherein the writing a confidential data bit value into the MTJ element comprises:

heating the MTJ element to a temperature above the first blocking temperature, generating a first external magnetic field such that both said first ferromagnetic structure and said second ferromagnetic structure are polarized in said first magnetization direction, and fixing said first ferromagnetic structure in said first storage magnetization direction by cooling the MTJ element to an intermediate temperature below the first blocking temperature and above the second blocking temperature.

3. The method of claim 2, wherein heating the MTJ element comprises generating a first heating current that passes through said MTJ element.

4. The method of claim 2, wherein generating said first external magnetic field comprises applying a first reference current on a field line that is magnetically coupled to said storage layer and said sense layer.

5. The method of claim 2, wherein fixing said first ferromagnetic structure in said first storage magnetization further comprises maintaining said first external magnetic field while cooling the MTJ element to said intermediate temperature.

6. The method of claim 2, wherein the storage layer and the sense layer of said MTJ element are magnetostatically coupled with an anti-parallel alignment of magnetization vectors, and wherein writing said confidential data bit value into the MTJ element further comprises, after fixing said first ferromagnetic structure in said first storage magnetization direction, terminating said external magnetic field while the MTJ element is at said intermediate temperature, thereby causing the sense layer to assume said associated preliminary storage magnetization direction that is opposite to the first storage magnetization direction of the storage layer by said magnetostatic coupling.

7. The method of claim 6, further comprising, after causing the sense layer to assume said associated preliminary storage magnetization direction, fixing said preliminary storage magnetization direction by cooling said MTJ element below the second blocking temperature.

8. The method of claim 2, wherein writing said input data bit value into the sense layer comprises:

heating the MTJ element to said intermediate temperature, generating a second external magnetic field such that said second ferromagnetic structure is polarized in said final storage magnetization direction, and fixing said second ferromagnetic structure in said final storage magnetization direction by cooling the MTJ element below the second blocking temperature.

9. The method of claim 8, wherein heating the MTJ element comprises generating a second heating current that passes through said MTJ element.

10. The method of claim 8, wherein generating said second external magnetic field comprises applying a second reference current on a field line that is magnetically coupled to said sense layer.

11. The method of claim 8, wherein fixing said second ferromagnetic structure in said final storage magnetization further comprises maintaining said second external magnetic field while cooling the MTJ element to said intermediate temperature.

12. The method of claim 11, wherein said detecting comprises:

terminating said second external magnetic field; and applying a read current through the MTJ element such that said read current passes through said MTJ element when said final storage magnetization direction matches said first storage magnetization direction, and such that said read current is prevented from passing through said MTJ element when said final storage magnetization direction fails to match said first storage magnetization direction.

13. The method of claim 1, wherein said at least one MTJ element further includes a field line that is magnetically coupled to said storage layer and said sense layer, wherein writing said confidential data bit value comprises applying a first reference current on said field line, wherein writing said input data bit value comprises applying a second reference current on said field line, and wherein detecting said resistance of said MTJ element comprises applying a read current through the MTJ element while zero current is applied to said field line.

14. A method for performing a high-speed compare operation using a Magnetic Tunnel Junction (MTJ) string including a plurality of Magnetic Tunnel Junction (MTJ) elements connected in series, wherein each said MTJ element includes a storage layer and a sense layer separated by a tunnel junction layer, the method comprising:

during a write/program operation, writing a confidential data bit value into each of said MTJ elements by orienting the storage layer of each said MTJ element in an associated first storage magnetization direction, and orienting the sense layer of said each MTJ element in an associated preliminary storage magnetization direction that is opposite to the first magnetization direction, whereby each of said plurality of MTJ elements exhibits a high resistance value at the end of said write/program operation;

during a pre-compare phase performed subsequent to the write/program operation, writing an input data bit value into the sense layer of each of said MTJ elements by orienting the sense layer of each said MTJ element in an associated final storage magnetization direction without changing said confidential data bit value non-volatilely stored in said non-volatile storage layer of each said MTJ element, whereby at the end of said pre-compare phase, said confidential data bit values are non-volatilely stored in said non-volatile storage layers of said plurality of MTJ elements and said input data bit values are non-volatilely stored in said non-volatile sense layers of said plurality of MTJ elements, wherein said each MTJ element retains said high resistance value when said final storage magnetization direction is the same as said preliminary storage magnetization direction, and said each MTJ element exhibits a low resistance value when said final storage magnetization direction is opposite to said preliminary storage magnetization direction; and during a compare phase performed subsequent to the pre-compare phase, detecting a resistance of said MTJ string by measuring a read current passed through said MTJ string, wherein each of said plurality of MTJ elements further includes an associated field line that is magnetically coupled to said storage layer and said sense layer of said each MTJ elements, wherein writing said confidential data bit values comprises applying first reference currents on said field lines, wherein writing said input data bit values comprises applying second reference currents on said field lines, and wherein detecting said resistance of said MTJ string comprises applying a read current through the plurality of MTJ elements while zero current is applied to said field lines.

15. The method of claim 14, wherein the storage layer of each said MTJ element comprises a first antiferromagnetic structure contacting a first ferromagnetic structure, the first antiferromagnetic structure comprising a first material having a first blocking temperature, wherein the sense layer of each said MTJ element comprises a second antiferromagnetic structure contacting a second ferromagnetic structure, the second antiferromagnetic structure comprising a second antiferromagnetic material having a second blocking temperature, and wherein the writing a confidential data bit value into each said MTJ element comprises:

heating the MTJ string to a temperature above the first blocking temperature, generating first external magnetic fields such that both said first ferromagnetic structure and said second ferromagnetic structure of each said MTJ element are polarized in first magnetization directions determined by an associated said first external magnetic field, and fixing said first ferromagnetic structures of said plurality of MTJ elements in said first storage magnetization directions by cooling the MTJ string to an intermediate temperature below the first blocking temperature and above the second blocking temperature.

16. The method of claim 15, wherein the storage layer and the sense layer of each said MTJ element are respectively magnetostatically coupled with an anti-parallel alignment of magnetization vectors, and wherein writing said confidential data bit values into the plurality of MTJ elements further comprises, after fixing said first ferromagnetic structures in said first storage magnetization directions, terminating said external magnetic fields while the MTJ string is at said intermediate temperature, thereby causing the sense layer each said MTJ element to assume said associated preliminary storage magnetization direction that is opposite to the first storage magnetization direction of the storage layer of said each MTJ element.

17. The method of claim 16, further comprising, after causing the sense layers of said plurality of MTJ elements to assume said associated preliminary storage magnetization directions, fixing said preliminary storage magnetization directions by cooling said MTJ string below the second blocking temperature.

18. The method of claim 15, wherein writing said input data bit value into the sense layer of each said MTJ element comprises:

heating the MTJ string to said intermediate temperature, generating second external magnetic fields such that said second ferromagnetic structure of each said MTJ element is polarized in said associated final magnetization directions determined by an associated said second external magnetic field, and fixing said second ferromagnetic structures of said plurality of MTJ elements in said final storage magnetization directions by cooling the MTJ string below the second blocking temperature.

19. The method of claim 18, wherein said detecting comprises:

terminating said second external magnetic fields; and applying a read current through said MTJ string, whereby said read current passes through said MTJ string when said final storage magnetization direction matches said first storage magnetization direction in all of said MTJ elements, said read current passing through said MTJ string when said final storage magnetization direction fails to match said first storage magnetization direction in at least one of said MTJ elements is lower than said read current passing through said MTJ string when said final storage magnetization direction matches said first storage magnetization direction in all of said MTJ elements.

* * * * *